United States Patent [19]

Kitamura et al.

[11] Patent Number: 5,132,806
[45] Date of Patent: Jul. 21, 1992

[54] SEMICONDUCTOR INTEGRATED CIRCUIT DEVICE

[75] Inventors: Yukinori Kitamura; Setsuo Ogura; Shiro Mayuzumi; Shunji Mori, all of Takasaki; Toshiyuki Fukamachi, Tomioka; Yuji Kobayashi, Takasaki; Kouichi Yamazaki; Makoto Furihata, both of Maebashi; Kazuyuki Kamegaki, Sawa, all of Japan

[73] Assignees: Hitachi, Ltd., Tokyo, Japan; Hitachi Microcomputer, Tokyo, Japan

[21] Appl. No.: 538,448

[22] Filed: Jun. 15, 1990

[30] Foreign Application Priority Data

Jun. 19, 1989 [JP] Japan .................. 1-157491

[51] Int. Cl.⁵ .............................. H04N 9/79
[52] U.S. Cl. ........................ 358/310; 58/27; 58/21 R; 58/28; 58/31; 357/48; 357/68
[58] Field of Search ............ 357/48, 68; 358/27, 358/21 R, 28, 31, 40, 310

[56] References Cited

U.S. PATENT DOCUMENTS 4,628,343 12/1986 Komatsu .

OTHER PUBLICATIONS

"Nikkei Electronics" issued by Nikkei McGraw-Hill Inc., dated Sep. 5, 1988 (No. 455), pp. 179-183.

Primary Examiner—Roy N. Envall, Jr.
Assistant Examiner—Robert Chevalier

[57] ABSTRACT

Disclosed is a novel semiconductor integrated circuit device for use in a color VTR (Video Tape Recorder). Concretely, the semiconductor integrated circuit device comprises a substantially rectangular semiconductor chip which has a principal surface, a luminance signal processing unit and a color signal processing unit which are disposed at the positions of the principal surface opposing to each other, and a semiconductor region which is provided in the interspace of the principal surface between the luminance signal and color signal processing units opposing to each other and which is supplied with a bias stable A.C.-wise. Further, the semiconductor region is located substantially at the central portion of the semiconductor chip and is extended so as to intersect with one set of opposing sides of the rectangular semiconductor chip.

18 Claims, 18 Drawing Sheets

FIG. 4

| PIN NO. | PIN-NAME (FUNCTION) | PIN NO. | PIN-NAME (FUNCTION) |
|---|---|---|---|
| 1 | REC DAC HPF DRIVE/PB NC HPF DRIVE | 56 | PB PICTURE CONT |
| 2 | REC DAC LIM IN/PB NC LIM IN | 55 | PB NC LPF |
| 3 | REC DE HPF/PB DDE HPF | 54 | Vcc(1) |
| 4 | REC BA IN/PB MDE IN | 53 | REC BA OUT/PB DDE OUT |
| 5 | PB LEVEL ADJ | 52 | VIDEO CLAMP IN |
| 6 | MDE(1) | 51 | CCD DRIVE VIDEO OUT |
| 7 | REC FBC/PB SYNC EXP | 50 | 1H DELAYED VIDEO IN |
| 8 | MDE(2) | 49 | NON CORRELATION SIGNAL OUT |
| 9 | ME NF | 48 | VIDEO OUT |
| 10 | ME OUT | 47 | EE LEVEL ADJ |
| 11 | REC ME VIDEO ADJ/REC·PB | 46 | VIDEO IN |
| 12 | FM MOD IN | 45 | FBC FILTER |
| 13 | GND(1) | 44 | SYNC SEP OUT |
| 14 | PB FM IN | 43 | SYNC SEP FILTER |
| 15 | FM OUT | 42 | PB AGC OUT/PB FM DEMO OUT |
| 16 | Vcc(2) | 41 | STABILIZED VOLTAGE SOURCE |
| 17 | PB COLOR ACC IN | 40 | REC BPF DRIVE/PB MAIN CONVERTER OUT |
| 18 | REC C LPF OUT/PB LNC ON·OFF | 39 | VIDEO AGC DET F/PB MAIN DET BIAS F |
| 19 | AUTO BALANCE DET FILTER | 38 | REC ACC IN/PB BURST DE IN |
| 20 | DISCRI OUT | 37 | ACC DET FILTER |
| 21 | 4.21MHz FILTER | 36 | COMB FILTER DRIVE |
| 22 | SP/LP/EP | 35 | COLOR KILLER DET FILTER |
| 23 | REC AFC DET FILTER/PB APC DET FILTER | 34 | REC C COMB IN/PB APC ACC DET AMP IN |
| 24 | fsc OUT | 33 | REC APC PD FILTER/PB SP IN |
| 25 | CR DET FILTER | 32 | PB Y/C MIX IN |
| 26 | X'TAL OSC OUT | 31 | SQUELCH IN/$\overline{BGP}$ OUT |
| 27 | X'TAL OSC IN | 30 | SW 30 KHz |
| 28 | GND(2) | 29 | 2fsc OUT |

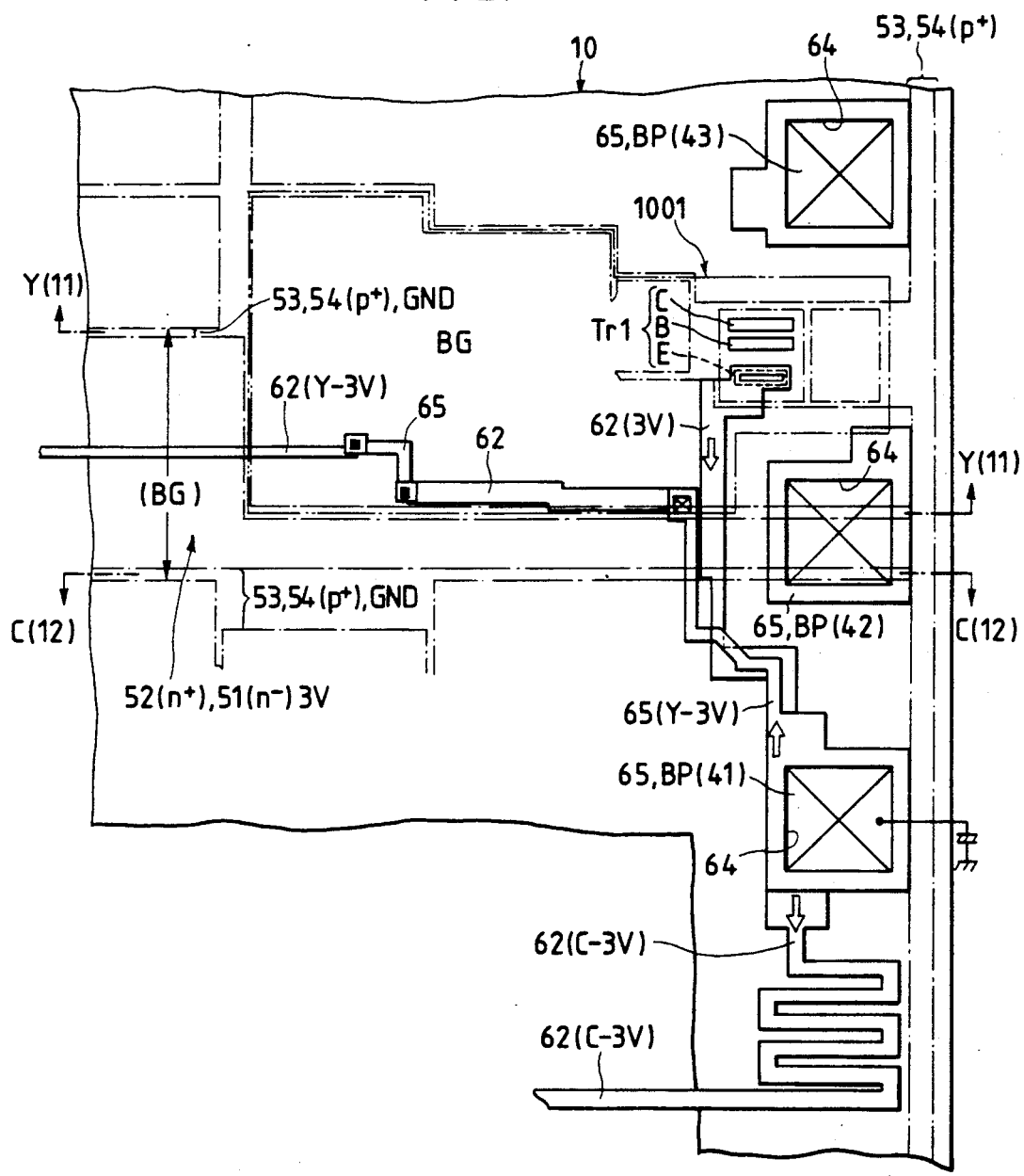

SEMICONDUCTOR INTEGRATED CIRCUIT DEVICE

BACKGROUND OF THE INVENTION

The present invention relates to semiconductor integrated circuit devices. More particularly, it relates to techniques which are effective when applied to a semiconductor integrated circuit device for use in a color VTR (Video Tape Recorder).

Color VTRs which are currently on the market, are furnished with the record (REC) function of recording a color picture and the playback (PB) function of playing back the recorded color picture.

The record of the color picture proceeds as follows: First, a color video signal generated through a receiving antenna as well as a tuner is isolated into a luminance signal (hereinbelow, also termed "Y signal") and a color signal (hereinbelow, also termed "C signal"). The isolated luminance signal is subjected to FM (frequency modulation), while the isolated color signal is subjected to frequency conversion. The frequency-modulated luminance signal and the frequency-converted color signal are mixed with each other, whereupon the resulting signal is recorded on a video tape through a video head.

The playback of the color picture proceeds as follows: First, the color picture recorded on the video tape is read out by a video head and is isolated into a luminance signal and a color signal. The isolated luminance signal is subjected to frequency demodulation, while the isolated color signal is subjected to frequency conversion. The frequency-demodulated luminance signal and the frequency-converted color signal are synthesized with each other into a color video signal. This color video signal is applied to a TV monitor so as to play back the color picture.

In order to reduce the size thereof, the color VTR stated above has an FM-modulator circuit, an FM-demodulator circuit and frequency converter circuits implemented in the form of ICs (semiconductor integrated circuit devices). The FM-modulator circuit and FM-demodulator circuit, and the frequency converter circuits deal with operating frequency bands different from each other, so that they are individually put into the ICs in order to reduce the degradation of a picture quality attributed to a crosstalk oscillation phenomenon. That is, the FM-modulator circuit of a record circuit and the FM-demodulator circuit of a playback circuit (luminance signal processing circuits) are constructed of one IC, while the frequency converter circuits of the record and playback circuits (color signal processing circuits) are constructed of the other IC.

By the way, the built-in ICs of the color VTRs are explained in, for example, "Nikkei Electronics" issued by Nikkei McGraw-Hill Inc., dated Sep. 5, 1988 (No. 455), pp. 179-183.

SUMMARY OF THE INVENTION

As the size of the color VTR is made smaller, further reduction in size is required of each of the IC including the lumiance signal processing circuits and the IC including the color signal processing circuits. The IC itself can have the density of integration heightened to some extent with enhancement in the microfabrication accuracy of semiconductor production process technology. Since, however, the density of integration of the IC itself is governed by the progress of microfabrication, a sharp rise in the density of integration cannot be expected. This has resulted in the problem that the rise in the density of integration of the IC cannot cope with the reduction in the size of the color VTR.

The inventor has therefore made researches and developments on one-chip implementation in which the luminance signal processing circuits and the color signal processing circuits are formed in a single IC. The one-chip implementation permits circuits and terminals to be shared by (made common to) the respective luminance signal processing circuits and color signal processing circuits, so that the density of integration can be sharply raised in correspondence with the shared portions. Since, however, the operating frequency bands of the luminance signal processing circuits and color signal processing circuits differ as stated before, the formation of these circuits in the single IC has led to the problem that the crosstalk oscillation phenomenon occurs to drastically degrade the picture quality of the color picture.

Objects of the present invention are as follows:

To provide a technique capable of heightening the density of integration of a semiconductor integrated circuit device for use in a color VTR.

To provide a technique capable of enhancing the picture quality of the color picture of a color VTR.

To provide a technique capable of heightening the density of integration of the semiconductor integrated circuit device and enhancing the picture quality of the color picture.

To provide a technique capable of enhancing available percentage in the production of the semiconductor integrated circuit device.

To provide a technique capable of enhancing the probing accuracy of the semiconductor integrated circuit device.

To provide a technique capable of enhancing the electrostatic breakdown voltage of the semiconductor integrated circuit device.

To provide a technique capable of preventing the latch-up phenomenon of the semiconductor integrated circuit device.

To provide, in a semiconductor integrated circuit device having bipolar transistors, a technique capable of increasing the current gains of the bipolar transistors.

To provide, in a semiconductor integrated circuit device having an IIL (Integrated Injection Logic) circuit of stacked structure, a technique capable of contracting the occupation area of the IIL circuit and heightening the density of integration of the device.

To provide, in the semiconductor integrated circuit device having the IIL circuit of stacked structure, a technique capable of widening the operating margin of the IIL circuit.

The above and other objects and novel features of the present invention will become apparent from the description of this specification when read with reference to the accompanying drawings.

Typical aspects of performance of the present invention are briefly summarized as follows:

A semiconductor integrated circuit device comprises a luminance signal processing unit and a color signal processing unit for a VTR, which are respectively constructed in regions of a principal surface of an identical semiconductor substrate opposing to each other, and an isolating portion (a semiconductor region) which is constructed in an interspace of the principal surface of said semiconductor substrate between said luminance signal processing unit and said color signal processing unit and which is supplied with a bias stable A.C.-wise.

Further, said luminance signal processing unit and said color signal processing unit comprise circuits including as their main constituents bipolar transistors which are formed in first and second ones of a plurality of active island regions that are surrounded with an element isolation region provided on said principal surface of said semiconductor substrate, respectively, and said isolating portion comprises that third one of said plurality of active island regions surrounded with said element isolation region which lies between the first and second active island regions and which is supplied with the bias.

Further, said third active island region of said isolating portion has a higher impurity density at a part lying in contact with said element isolation region, than at any other part.

A semiconductor integrated circuit device comprises a luminance signal processing unit and a color signal processing unit for a VTR, which are constructed in regions of a principal surface of an identical semiconductor substrate different from each other and each of which includes a plurality of circuit blocks, said circuit blocks of each of said luminance signal processing unit and said color signal processing unit being in shapes of rectangles among which a length of one latus is constant or integral times greater, and circuit operation supply voltage wiring and reference supply voltage wiring which are respectively laid on one-end sides of the rectangular circuit blocks and the other-end sides thereof.

Further, said circuit operation supply voltage wiring on one-end sides or said reference supply voltage wiring on the other-end sides of said circuit blocks of said luminance signal processing unit, and said reference supply voltage wiring on the other-end sides or said circuit operation supply voltage wiring on one-end sides of said circuit blocks of said color signal processing unit are laid at a boundary part between said luminance signal processing unit and said color signal processing unit.

A resin-encapsulated semiconductor device comprises a semiconductor integrated circuit device including a luminance signal processing unit and a color signal processing unit for a VTR, which are constructed in regions of a principal surface of an identical semiconductor substrate different from each other and each of which includes a plurality of circuit blocks, and circuit operation supply voltage wiring and reference supply voltage wiring which are respectively laid on one-end sides and the other-end sides of said circuit blocks of each of said luminance signal processing unit and said color signal processing unit, said semiconductor integrated circuit device being sealed with a resin.

A semiconductor integrated circuit device comprises a luminance signal processing unit and a color signal processing unit for a VTR, which are constructed in regions of a principal surface of an identical semiconductor substrate different from each other, supply-voltage wiring lines which are led in from supply-voltage external terminals and which are laid in said luminance signal processing unit, and supply-voltage wiring lines which are led in from supply-voltage external terminals different from those of said supply-voltage external terminals of said luminance signal processing unit and which are laid in said color signal processing unit.

Further, each of said supply-voltage external terminals of said luminance signal processing unit is divided into a plurality of external terminals, from which the supply-voltage wiring lines are respectively led in, and each of said supply-voltage external terminals of said color signal processing unit is divided into a plurality of external terminals, from which the supply-voltage wiring lines are respectively led in.

Further, one and another of the plurality of divisional supply-voltage external terminals of said luminance signal processing unit are short-circuited to each other through supply-voltage wiring lines which are led in from the respective divisional supply-voltage terminals.

Further, the supply voltage wiring led in from the supply-voltage external terminal of said luminance signal processing unit, and the supply voltage wiring led in from the supply-voltage external terminal of said color signal processing unit are both laid at a boundary part between said luminance signal processing unit and said color signal processing unit.

A semiconductor integrated circuit device comprises a luminance signal processing unit and a color signal processing unit for a VTR, which are constructed in regions of a principal surface of an identical semiconductor substrate different from each other, and a common circuit which is shared by said luminance signal processing unit and said color signal processing unit and which is arranged at a boundary part between these units.

Further, wiring for connecting said luminance signal processing unit with said common circuit and wiring for connecting said color signal processing unit with said common circuit are laid independently of each other.

Further, said common circuit is a stabilized power source circuit, and said external terminal which is fed with the D.C. reference supply voltage generated by said stabilized power source circuit is interposed between an external terminal for a signal of said luminance signal processing unit and an external terminal for a signal of said color signal processing unit.

A semiconductor integrated circuit device wherein an emitter region of a p-n-p bipolar transistor of vertical structure constituting an output stage circuit is connected to an external terminal; comprises the fact that a diode element is interposed between said emitter region and a collector region of said p-n-p bipolar transistor of said output stage circuit having the vertical structure, said diode element having a breakdown voltage lower than a p-n junction breakdown voltage between said emitter region and a base region of said p-n-p bipolar transistor and having its anode side connected to said collector region and its cathode side connected to said emitter region.

Further, said p-n-p bipolar transistor of said vertical structure has a plurality of divided emitter openings.

A semiconductor integrated circuit device wherein a plurality of stages of IIL circuits, in each of which a plurality of injection wiring lines and a plurality of reference-supply-voltage wiring lines are respectively laid substantially in parallel, are stacked; comprises the fact that said plurality of stages of IIL circuits are arranged in an extending direction of said injection wiring lines and said reference-supply-voltage wiring lines, and that said plurality of reference-supply-voltage wiring lines of the preceding-stage IIL circuit among said plurality of stages of IIL circuits are connected with said plurality of injection wiring lines of the succeeding-stage IIL circuit among them.

Further, said plurality of reference-supply-voltage wiring lines of said preceding-stage IIL circuit and said plurality of injection wiring lines of said succeeding-stage IIL circuit are connected in an element isolation region which lies at a boundary part between said preceding-stage IIL circuit and said succeeding-stage IIL circuit.

According to the constructions described above, the following operations and effects are attained:

As compared with the case where the luminance signal processing unit and the color signal processing unit are respectively constructed in the principal surfaces of individual semiconductor substrates (the case where they are individually put into ICs), the implementation in the shape of one chip can contract especially the area of shared portions (circuits and external terminals) to the utmost, so that the density of integration of the semiconductor integrated circuit device can be heightened. Simultaneously, the isolating portion can relieve the crosstalk oscillation phenomenon between the luminance signal of the luminance signal processing unit and the color signal of the color signal processing unit, so that noise to develop in both the luminance signal and the color signal can be reduced. The reduction of the noise to develop in both the luminance signal and the color signal can enhance the picture quality of the color picture of the color VTR.

Moreover, since the crosstalk oscillation phenomenon between the luminance signal of the luminance signal processing unit and the color signal of the color signal processing unit can be relieved, the spacing between the luminance signal processing unit and the color signal processing unit can be shortened to heighten the density of integration of the semiconductor integrated circuit device still more.

Further, the isolating portion operates as a low-pass filter (LPF) for both the luminance signal processing unit and the color signal processing unit and can increase a parasitic resistance to be formed between the luminance signal processing unit and the color signal processing unit, in correspondence with the active island region, so that the crosstalk oscillation phenomenon of higher frequency band between the luminance signal and the color signal can be relieved still more by the LPF.

Further, since the isolating portion can increase a parasitic capacitance to be formed between the active island region and the element isolation region, the crosstalk oscillation phenomenon of higher frequency band between the luminance signal and the color signal can be relieved still more by the LPF.

Further, as compared with the case where the luminance signal processing unit and the color signal processing unit are respectively constructed in the principal surfaces of individual semiconductor substrates, the implementation in the shape of one chip can contract especially the area of shared portions to the utmost, so that the density of integration of the semiconductor integrated circuit device can be heightened. Simultaneously, the circuit operation supply voltage wiring of the respective circuit blocks and the reference supply voltage wiring thereof can be connected with the shortest distances, and the lengths to-be-led-about of the supply voltage wiring lines for connecting the respective circuit blocks can be decreased, so that the density of integration of the semiconductor integrated circuit device can be heightened still more in correspondence with the decrease of the lengths to-be-led-about of the supply voltage wiring lines.

Further, owing to the supply voltage wiring of the circuit blocks of the luminance signal processing unit and the independent supply voltage wiring of the circuit block of the color signal processing unit having no common impedance with the former, the crosstalk oscillation phenomenon between the luminance signal of the luminance signal processing unit and the color signal of the color signal processing unit can be relieved, so that noise to develop in both the luminance signal and the color signal can be reduced. As a result, the picture quality of the color picture of the color VTR can be enhanced.

Moreover, currents to flow through all the circuit blocks of the luminance signal processing unit and the color signal processing unit arranged in the semiconductor integrated circuit device can be brought into substantially one direction, and the magnitudes of fluctuations in the piezoelectric effect attributed to stresses appearing after the resin encapsulation can be rendered uniform in all the circuit blocks. It is therefore possible to widen the circuit operation margins of the processing units, and to enhance the available percentage of the resin-encapsulated semiconductor device in the production thereof.

Further, since the supply voltage wiring of the luminance signal processing unit and that of the color signal processing unit have no common impedance therebetween, the crosstalk oscillation phenomenon between the luminance signal of the luminance signal processing unit and the color signal of the color signal processing unit can be relieved, and noise to develop in both the luminance signal and the color signal can be reduced. As a result, the picture quality of the color picture of the color VTR can be enhanced.

Still further, since the common impedances can be reduced between the supply voltage wiring lines of the luminance signal processing unit and between those of the color signal processing unit, noise to develop in both the luminance signal and the color signal can be reduced still more.

Yet further, in probing characteristics, the contact resistance between a probe and one supply-voltage external terminal can be canceled by the contact resistance between another probe and another supply-voltage external terminal, so that the accuracy of the characteristics probing can be enhanced.

In addition, owing to the supply voltage wiring of the luminance signal processing unit and the independent supply voltage wiring of the color signal processing unit having no common impedance with the former, the crosstalk oscillation phenomenon between the luminance signal of the luminance signal processing unit and the color signal of the color signal processing unit can be relieved, so that noise to develop in both the luminance signal and the color signal can be reduced still more.

Besides, as compared with the case where the luminance signal processing unit and the color signal processing unit are respectively constructed in the principal surfaces of individual semiconductor substrates, the implementation in the shape of one chip can contract especially the area of shared portions to the utmost, so that the density of integration of the semiconductor integrated circuit device can be heightened. Simultaneously, the connection distances between the luminance signal processing unit and the common circuit and those between the color signal processing unit and the common circuit can be respectively made the shortest, and the lengths to-be-led-about of the wiring lines for connecting the luminance signal processing unit and the common circuit and the wiring lines for connecting the color signal processing unit and the common circuit can be respectively decreased, so that the density of integration of the semiconductor integrated circuit device can be heightened still more in correspondence with the decrease of the lengths to-be-led-about of the supply voltage wiring lines.

Besides, the wiring lines for connecting the luminance signal processing unit and the common circuit and the wiring lines for connecting the color signal processing unit and the common circuit can be respectively shortened to lower the probability at which the crosstalk oscillation phenomenon occurs between the individual wiring lines, so that noise to develop in both the luminance signal and the color signal can be reduced.

Further, since the wiring lines for connecting the luminance signal processing unit and the common circuit and those for connecting the color signal processing unit and the common circuit do not have common impedances therebetween, the crosstalk oscillation phenomenon between the wiring lines can be relieved, and noise to develop in both the luminance signal and the color signal can be reduced.

Further, the crosstalk oscillation phenomenon between terminals, which arises between the signal external terminal of the luminance signal processing unit and the signal external terminal of the color signal processing unit, can be relieved by the external terminal supplied with the D.C. reference supply voltage, so that noise to develop in both the luminance signal and the color signal can be reduced.

Further, in a case where an excess current incurring electrostatic breakdown is applied to the external terminal, it can be absorbed into the power source side through the diode element, so that the breakdown of the p-n junction between the emitter region and base region of the p-n-p bipolar transistor of vertical structure can be prevented to enhance the electrostatic breakdown voltage thereof.

In addition, the potential of the base region of a parasitic p-n-p bipolar transistor of vertical structure is normally held higher than the potential of the emitter region thereof (the collector region of the p-n-p bipolar transistor of vertical structure) by the diode element, so that the operation of a parasitic thyristor which is constituted by the p-n-p bipolar transistor of vertical structure and the parasitic p-n-p bipolar transistor of vertical structure can be avoided to prevent the latch-up phenomenon. The parasitic p-n-p bipolar transistor of vertical structure is so constructed that its emitter region is the collector region of the p-n-p bipolar transistor of vertical structure, that its collector region is the semiconductor substrate, and that its base region is the buried semiconductor region for isolating the semiconductor substrate and the collector region of the p-n-p bipolar transistor of vertical structure.

Further, the magnitude of the base current of the p-n-p bipolar transistor of vertical structure can be decreased to increase the magnitude of the forward emitter current thereof, so that the current gain ($h_{FE}$) of the transistor can be enlarged.

Moreover, by connecting either of the plurality of reference supply voltage wiring lines of the preceding-stage IIL circuit and the plurality of injection wiring lines of the succeeding-stage IIL circuit, the other of them can be connected. It is therefore possible to decrease the wiring area and heighten the density of integration of the semiconductor integrated circuit device, in correspondence with wiring for connecting the plurality of injection wiring lines of the succeeding-stage IIL circuit or the plurality of reference supply voltage wiring lines of the preceding-stage IIL circuit.

In addition, the length of wiring can be shortened to the extent of connecting the plurality of reference supply voltage wiring lines of the preceding-stage IIL circuit and the plurality of injection wiring lines of the succeeding-stage IIL circuit, and the resistance of the wiring can be lowered. Therefore, the potential rise of the reference supply voltage wiring lines and the potential fall of the injection wiring lines are canceled to render current balances uniform in both the preceding-stage IIL circuit and the succeeding-stage IIL circuit. As a result, the operating margin of the IIL circuit of stacked structure can be widened.

Besides, the plurality of reference supply voltage wiring lines or the plurality of injection wiring lines can be connected by utilizing the occupation area of the element isolation region, so that the density of integration of the semiconductor can be heightened in correspondence with a wiring area for the connection.

BRIEF DESCRIPTION OF THE DRAWINGS

FIG. 4 is a table listing the functions of the various pins of the resin-encapsulated semiconductor device;

FIG. 11 is a plan view of the essential portions of the semiconductor integrated circuit device;

DESCRIPTION OF THE PREFERRED EMBODIMENTS

Now, the construction of the present invention will be described in conjunction with embodiments in each of which the present invention is applied to a semiconductor integrated circuit device for use in a color VTR.

Throughout the drawings for describing the embodiments, the same symbols are assigned to functionally identical parts, which shall not be repeatedly explained.

EMBODIMENT I

Figure 2:
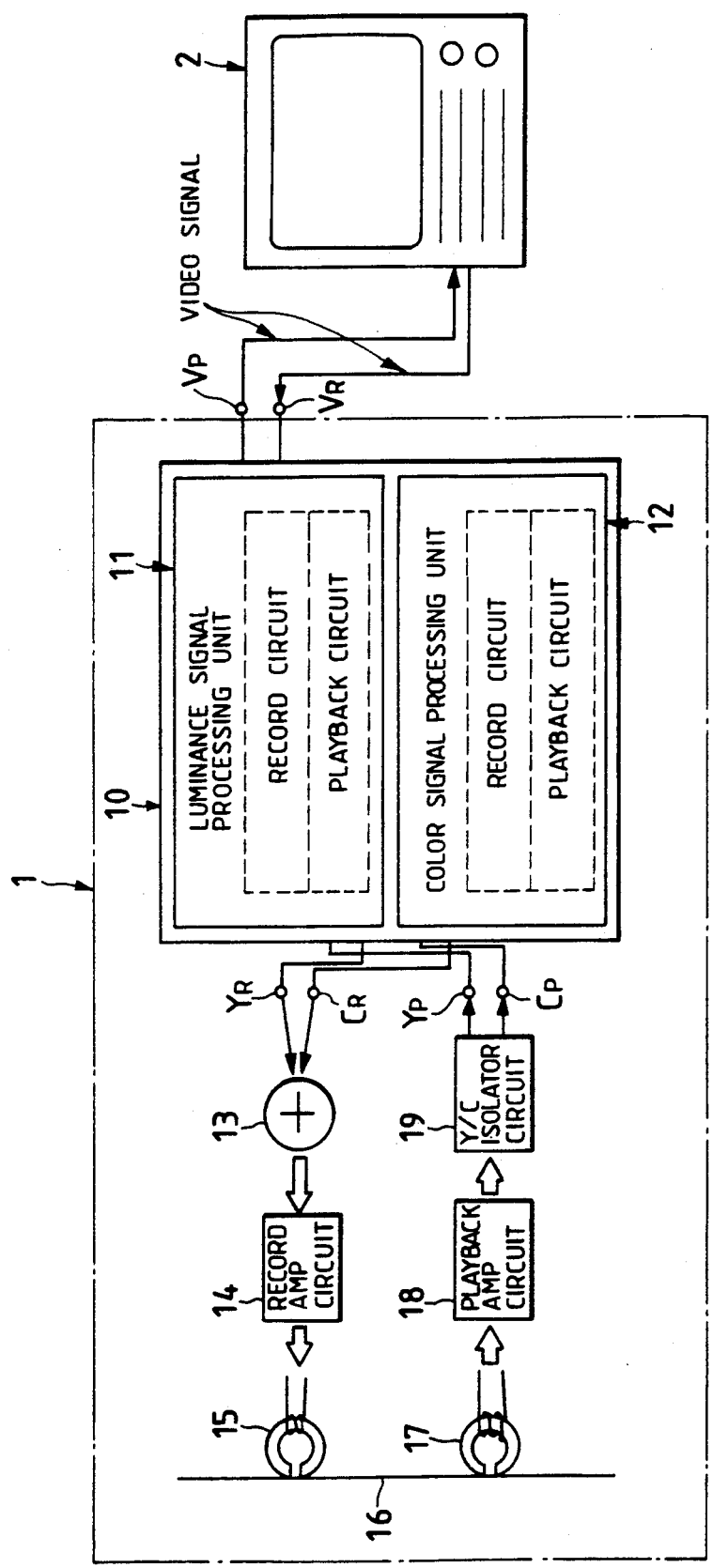
FIG. 2 is a system setup diagram of the color VTR.

The system setup of a color VTR which is Embodiment I of the present invention, is shown in FIG. 2 (a system setup diagram).

As shown in FIG. 2, the color video signal terminals $V_R$ and $V_P$ of the color VTR 1 are respectively connected to a TV monitor 2. The color video signal terminal $V_R$ is supplied with a color video signal which is generated through a receiving antenna and a TV/VTR tuner, not shown. The color VTR 1 records a color picture on the basis of the color video signal. The color video signal terminal $V_P$ supplies the color picture recorded in the color VTR 1, as a color video signal. On the basis of this color video signal, the TV monitor 2 plays back the color picture recorded in the color VTR 1.

The color video signal supplied to the color video signal terminal $V_R$ of the color VTR 1 is isolated into a luminance signal (Y signal) and a color signal (C signal). The luminance signal being one of the isolated signals is subjected to FM (frequency modulation) in the record circuit of a luminance signal processing unit (Y signal processing unit) 11. The frequency-modulated luminance signal is delivered to a luminance signal output terminal $Y_R$. The color signal being the other of the isolated signals is subjected to frequency conversion in the record circuit of a color signal processing unit (C signal processing unit) 12. The frequency-converted color signal is delivered to a color signal output terminal $C_R$. Both the luminance signal delivered to the luminance signal output terminal $Y_R$ and the color signal delivered to the color signal output terminal $C_R$ are mixed by an adder 13. The mixed luminance and color signals are recorded on a video tape 16 as the color picture through a record amplifier circuit 14 and a recording video head 15.

The color picture, namely, the luminance and color signals recorded on the video tape 16 is/are read out by a playing-back video head 17. The lumiance and color signals read out are amplified by a playback amplifier circuit 18, and then isolated by a Y/C isolator circuit 19. The luminance signal being one of the isolated signals is delivered to a luminance signal input terminal $Y_P$. This luminance signal applied to the luminance signal input terminal $Y_P$ is subjected to frequency demodulation in the playback circuit of the luminance signal processing unit 11. The color signal being the other of the isolated signals is delivered to a color signal input terminal $C_P$. This color signal applied to the color signal input terminal $C_P$ is subjected to frequency conversion in the playback circuit of the color signal processing unit 12. Both the frequency-demodulated luminance signal and the frequency-converted color signal are mixed into the color video signal, which is supplied to the color video signal terminal $V_P$.

Figure 3:
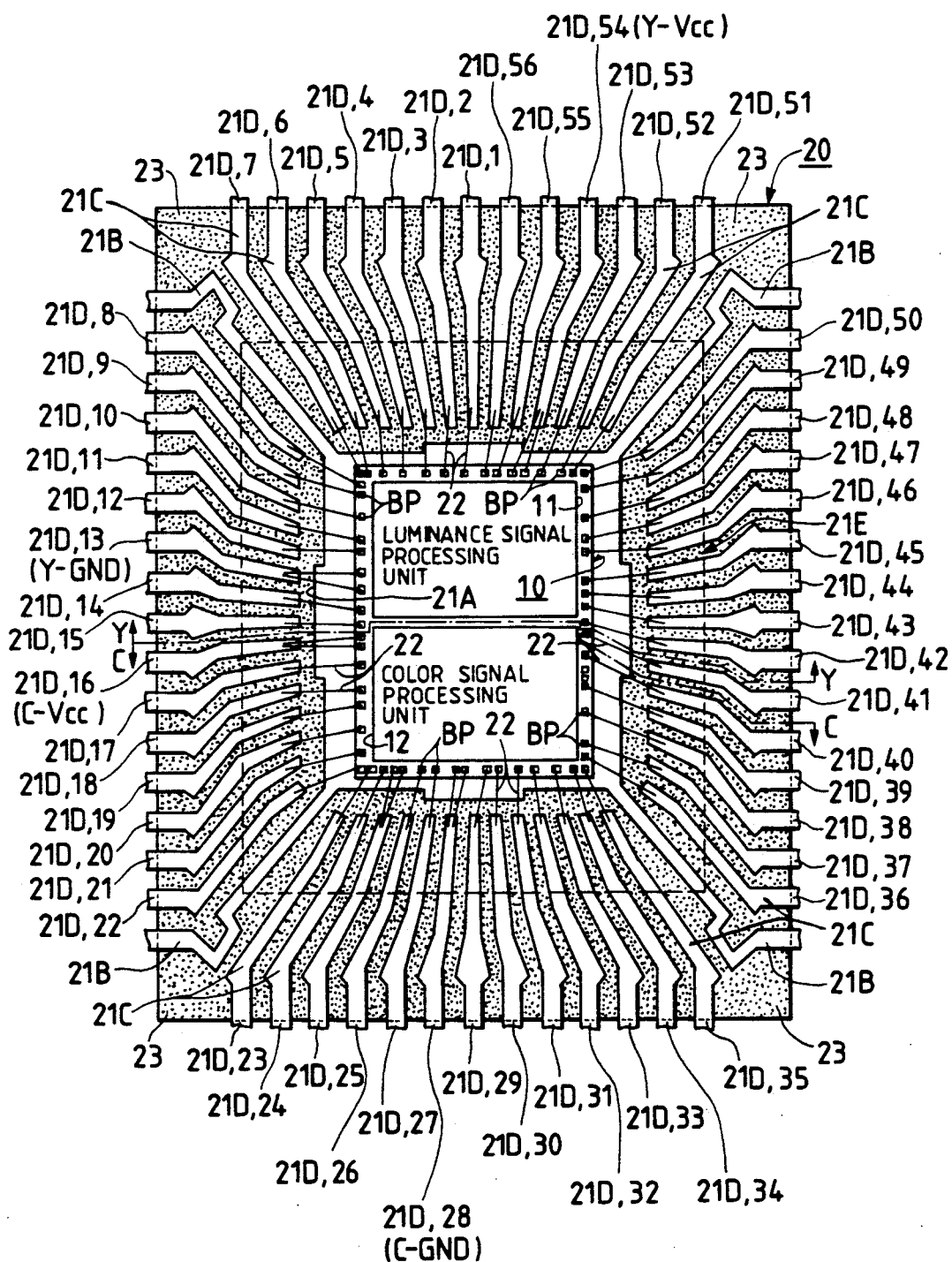
FIG. 3 is a plan view, partially in section, of a resin-encapsulated semiconductor device in which the semiconductor integrated circuit device is assembled.

The luminance signal processing unit 11 and color signal processing unit 12 of the color VTR 1 are formed in a single semiconductor integrated circuit device (IC) 10. That is, they are implemented in the shape of one chip. The semiconductor integrated circuit device 10 is assembled in a resin-encapsulated semiconductor device 20 as shown in FIG. 3 (a partially-sectional plan view). The resin-encapsulated semiconductor device 20 is constructed with a so-called MSP (Mini Square Package) structure.

The resin-encapsulated semiconductor device 20 is such that the semiconductor integrated circuit device (semiconductor pellet) 10 is placed on the front surface of a tab 21A. The semiconductor integrated circuit device 10 is rectangular in plan. It is constructed with a plan size of $4.7 \times 6.0$ [mm$^2$]. A plurality of external terminals (bonding pads) BP are arrayed in regions which extend along the peripheral edges of the rectangle of the semiconductor integrated circuit 10. In FIG. 3, the luminance signal processing unit 11 is arranged on the upper side of the semiconductor integrated circuit device 10, while the color signal processing unit 12 is arranged on the lower side. In other words, the semiconductor integrated circuit device 10 is, in effect, divided into two, upper and lower parts by the luminance signal processing unit 11 and the color signal processing unit 12 with a boundary set at the central part thereof.

The tab 21A has a rectangular plan shape in correspondence with the plan shape of the semiconductor integrated circuit device 10. The front surface of the tab 21A and the rear surface of the semiconductor integrated circuit device 10 (the surface of the device 10 opposite to the element forming surface thereof) are bonded to each other with an adhesion layer of, for example, Ag paste or Au-Si eutectic alloy. The tab 21A is supported by tab suspension leads 21B at the four corners of its rectangle. Although not especially restricted, the tab 21A is constructed with a lowered tab structure in which it is situated at a position somewhat lower than inner leads 21C to be described later. The lowered tab structure can reduce the level difference between first bonding positions (BP side) and second bonding positions (21C side), thereby to diminish bonding defects at a wire bonding step.

The plurality of inner leads 21C are arrayed, at positions which lie along the lateral sides of the rectangle of the tab 21A. The inner leads 21C are arranged with their fore end sides opposed to the tab 21A and with their other end sides extended radiately substantially about the tab 21A. The other end side of each inner lead 21C is made unitary with a corresponding outer lead 21D. That is, the inner leads 21C and the outer leads 21D are arranged in four directions, and the resin-encapsulated semiconductor device 20 present a so-called four-directional lead structure.

The tab 21A, tab suspension leads 21B, inner leads 21C and outer leads 21D mentioned above are all cut and formed from an identical lead frame. That is, they are made of an identical material. The lead frame is formed of, for example, Cu or a Cu alloy the electric conductivity and thermal conductivity of which are favorable. Alternatively, it may well be formed of an Fe-Ni alloy (the Ni content of which is 42 [%] by way of example). Ag plating layers 21E are deposited on those parts of the front surfaces of the inner leads 21C which include at least the second bonding positions, in other words, within a region enclosed with a broken line in FIG. 3. The Ag plating layers 21E are formed for the purpose of enhancing the bondability between the inner leads 21C and pieces of bonding wire. Although not shown, solder plating layers are deposited on the front surfaces of the outer leads 21D. The solder plating layers are used as a binder in the case of installing the semiconductor device 20 on a mounting circuit board. These solder plating layers are formed after the formation of the lead frame, and either before resin encapsulation (prior soldering) or after the resin encapsulation (posterior soldering). In a case where bipolar transistors are included in the semiconductor integrated circuit device 10, it is the main stream to deposit the solder plating layers on the front surfaces of the outer leads 21D. It is also allowed, however, to deposit Au plating layers or Ag plating layers.

The fore end side of each of the inner leads 21C is electrically connected with the corresponding external terminal BP of the semiconductor integrated circuit device 10. The connection is effected with pieces of bonding wire 22. By way of example, Cu wire is used as the bonding wire 22. In the bonding operation, the Ag plating layer 21E stated earlier intervenes between the inner lead 21C and the bonding wire piece 22.

The semiconductor integrated circuit device 10, tab 21A and inner leads 21C described earlier are hermetically sealed with a resin mold 23. By way of example, an epoxy resin is used for the resin mold 23.

The outer leads (pins or terminals) 21D which protrude from the resin mold 23 of the resin-encapsulated semiconductor device 20 thus constructed, are respectively numbered on the basis of standards and have signals and supply voltages of predetermined functions applied thereto. The names of the signals and supply voltages which are applied to the individual outer leads 21D are listed in FIG. 4.

As shown in FIGS. 3 and 4, the resin-encapsulated semiconductor device 20 has pins Nos. 1 thru 15 and pins Nos. 42 thru 56 arranged around the luminance signal processing unit 11 of the semiconductor integrated circuit device 10. These pins are connected to the luminance signal processing unit 11. On the other hand, the resin-encapsulated semiconductor device 20 has pins Nos. 16 thru 40 arranged around the color signal processing unit 12 of the semiconductor integrated circuit device 10. These pins are connected to the color signal processing unit 12. In addition, the resin encapsulated semiconductor device 20 has a pin No. 41 located between the luminance signal processing unit 11 and the color signal processing unit 12.

The pin No. 1 connected to the luminance signal processing unit 11 has a dynamic aperture control drive signal (REC) or a noise cancel drive signal (PB) applied thereto. The pin No. 2 has a dynamic aperture control input signal (REC) or a noise cancel input signal (PB) applied thereto. The pin No. 3 has a dynamic emphasis filter (REC) or a dynamic deemphasis filter (PB) connected thereto. Applied to the pin No. 4 is a buffer amplifier input signal (REC) or a main deemphasis input signal (PB). The pin No. 5 and the pin No. 6 are respectively supplied with a level adjust signal ( PB ) and a main deemphasis (1) signal. The pin No. 7 has a feedback clamp signal (REC) or a sync expand signal (PB) applied thereto. The pins No. 8, No. 9 and No. 10 are respectively supplied with a main deemphasis (2) signal, a main emphasis (NF) signal and a main emphasis output signal. Applied to the pin No. 11 is a main emphasis video adjust signal or a record/playback switch signal. The pin No. 12 has an FM-modulation input signal applied thereto The pin No. 13 has a reference supply voltage (GND) applied thereto. The reference supply voltage applied to the pin No. 13 is fed to the luminance signal processing unit 11, and is the ground potential, 0 [V] of the circuitry. A luminance signal input terminal $Y_P$ and a luminance signal output terminal $Y_R$ are respectively connected to the pins No. 14 and No. 15.

The pin No. 42 has an AGC output signal (PB) or an FM-demodulation output signal (PB) applied thereto. A sync separating filter is connected to the pin No. 43, and a sync separating output signal is applied to the pin No. 44. The pin No. 45 has a feedback clamp filter connected thereto, and the pin No. 46 is a color video signal terminal $V_R$ (REC). The pin No. 47 has an EE level signal applied thereto, and the pin No. 48 is a color video signal terminal $V_P$ (PB). The pin No. 49 is supplied with a correlation output signal, the pin No. 50 with a 1H-delayed video input signal, the pin No. 51 with a CCD drive video output signal, and the pin No. 52 with a video clamp input signal. Applied to the pin No. 53 is a buffer amplifier output signal (REC) or a dynamic deemphasis output signal (PB). The pin No. 54 has a circuit operation supply voltage ($V_{CC}$) applied thereto. The circuit operation supply voltage is fed to the luminance signal processing unit 11, and it is the operating voltage of the circuitry, for example, 5 [V]. A noise cancel filter (PB) is connected to the pin No. 55, and a picture control signal (PB) is applied to the pin No. 56.

The pin No. 16 connected to the color signal processing unit 12 has the circuit operation supply voltage ($V_{CC}$) applied thereto. The circuit operation supply voltage is fed to the color signal processing unit 12, and it is the operating voltage of the circuitry, for example, 5 [V]. The pin No. 17 is a color signal input terminal $C_P$. The pin No. 18 serves as a color signal output terminal $C_R$, or it has an ON/OFF switch signal of LNC applied thereto. The pin No. 19 is connected to an auto balance detector filter. The pin No. 20 has a discriminator output signal applied thereto. The pin No. 21 has a filter of 4.21 [MHz] connected thereto. Applied to the pin No. 22 is an SP/LP/EP switch signal. Connected to the pin No. 23 is an AFC detector filter (REC) or an APC detector filter (PB). An $f_{sc}$ output signal is applied to the pin No. 24. A CR time constant filter is connected to the pin No. 25. The pins No. 26 and No. 27 are respectively supplied with a crystal oscillation output signal and a crystal oscillation input signal. The pin No. 28 has the reference supply voltage (GND) applied thereto. The reference supply voltage applied to the pin No. 28 is fed to the color signal processing unit 12, and is the ground potential, 0 [V] of the circuitry. The pins No 29 and No. 30 are respectively supplied with an output signal of 2 $f_{sc}$ and a switch signal of 30 [Hz]. A squelch control input signal or a burst gate pulse output signal is applied to the pin No. 31. A bias signal for mixing Y/C is applied to the pin No. 32. The pin No. 33 has an APC PD filter (REC) connected thereto, or it has an SP special playback input signal (PB) applied thereto. Applied to the pin No. 34 is a color comb input signal (REC) or an APC ACC detector amplifier input signal. A color killer detector filter is connected to the pin No. 35, and a comb filter drive signal is applied to the pin No. 36. The pin No. 37 has an ACC detector filter connected thereto. An ACC input signal (REC) or a burst deemphasis input signal (PB) is applied to the pin No. 38. A video AGC detector filter or a main detector bias filter (PB) is connected to the pin No. 39. Applied to the pin No. 40 is a BPF drive signal (REC) or a main converter output signal.

The pin No. 41 which is located between the luminance signal processing unit 11 and the color signal processing unit 12 is fed with a D.C. reference supply voltage which is stable A.C.-wise (grounded A.C.-wise). The D.C. reference supply voltage is set at a voltage of, for example, 3 [V] which is stable against the ripple of the circuit operation supply voltage $V_{CC}$.

Usually, the outer leads 21D (pins or terminals) required for the luminance signal processing unit 11 are in the number of at least 36, and the outer leads 21D required for the color signal processing unit 12 are in the number of at least 28, so that the required outer leads total 64. The resin-encapsulated semiconductor device 20 of this embodiment has both the luminance signal processing unit 11 and the color signal processing unit 12 arranged in the single semiconductor integrated circuit device 10, whereby 8 pins can be shared by both the luminance signal processing unit 11 and the color signal processing unit 12. Since 8 pins are shared, only 56 pins rather than 64 pins are needed. The pins which are shared by both the luminance signal processing unit 11 and the color signal processing unit 12 are the pins Nos. 18, 22, 30, 31, 32, 41, 44 and 46.

Besides, as described earlier, the resin-encapsulated semiconductor device 20 is so constructed that the outer leads 21D (pins or terminals) to be connected to the luminance signal processing unit 11 are collectively arranged along the perimeter of this processing unit 11. That is, the pins Nos. 1 thru 15 and Nos. 42 thru 56 are arranged on the upper side in FIG. 3 on which the luminance signal processing unit 11 is situated, with the boundary at the pins Nos. 15 and 42. Likewise, the resin-encapsulated semiconductor device 20 is so constructed that the outer leads 21D (pins or terminals) to be connected to the color signal processing unit 12 are collectively arranged along the perimeter of this processing unit 12. That is, the pins Nos. 16 thru 40 are arranged on the lower side in FIG. 3 on which the color signal processing unit 12 is situated, with the boundary at the pins Nos. 16 and 40.

The resin-encapsulated semiconductor device 20 thus constructed can reduce the development of noise in each of luminance circuit signals and color circuit signals in such a way that the outer leads 21D to which the signals of different operating frequency bands are applied are isolated from each other, thereby to relieve the crosstalk oscillation phenomenon which arises between the outer leads 21D connected to the luminance signal processing unit 11 and the outer leads 21D connected to the color signal processing unit 12.

In addition, the resin-encapsulated semiconductor device 20 includes the outer leads 21D to which the stable supply voltages are respectively applied and which are respectively interposed between the outer leads 21D connected to the luminance signal processing unit 11 and those connected to the color signal processing unit 12. More specifically, the pin No. 16 fed with the circuit operation supply voltage $V_{CC}$ (the circuit operation supply voltage $V_{CC}$ of the color signal processing unit 11) is interposed between the pin No. 15 connected to the luminance signal processing unit 11 and the pin No. 17 connected to the color signal processing unit 12. Further, the pin No. 41 fed with the D.C. reference supply voltage (3 [V]) is interposed between the pin No. 42 connected to the luminance signal processing unit 11 and the pin No. 40 connected to the color signal processing unit 12.

The resin-encapsulated semiconductor device 20 thus constructed can reduce the development of noise in each of the luminance circuit signals and the color circuit signals in such a way that the stable supply voltages are allocated between the outer leads 21D connected to the luminance signal processing unit 11 and the outer leads 21D connected to the color signal processing unit 12, thereby to more relieve the crosstalk oscillation phenomenon which arises between them.

Now, the practicable arrangement of the semiconductor integrated circuit device 10 of the resin-encapsulated semiconductor device 20 stated above will be briefly described with reference to FIG. 1 (a circuit block arrangement diagram) and FIG. 5 (a chip layout plan).

Figure 1:
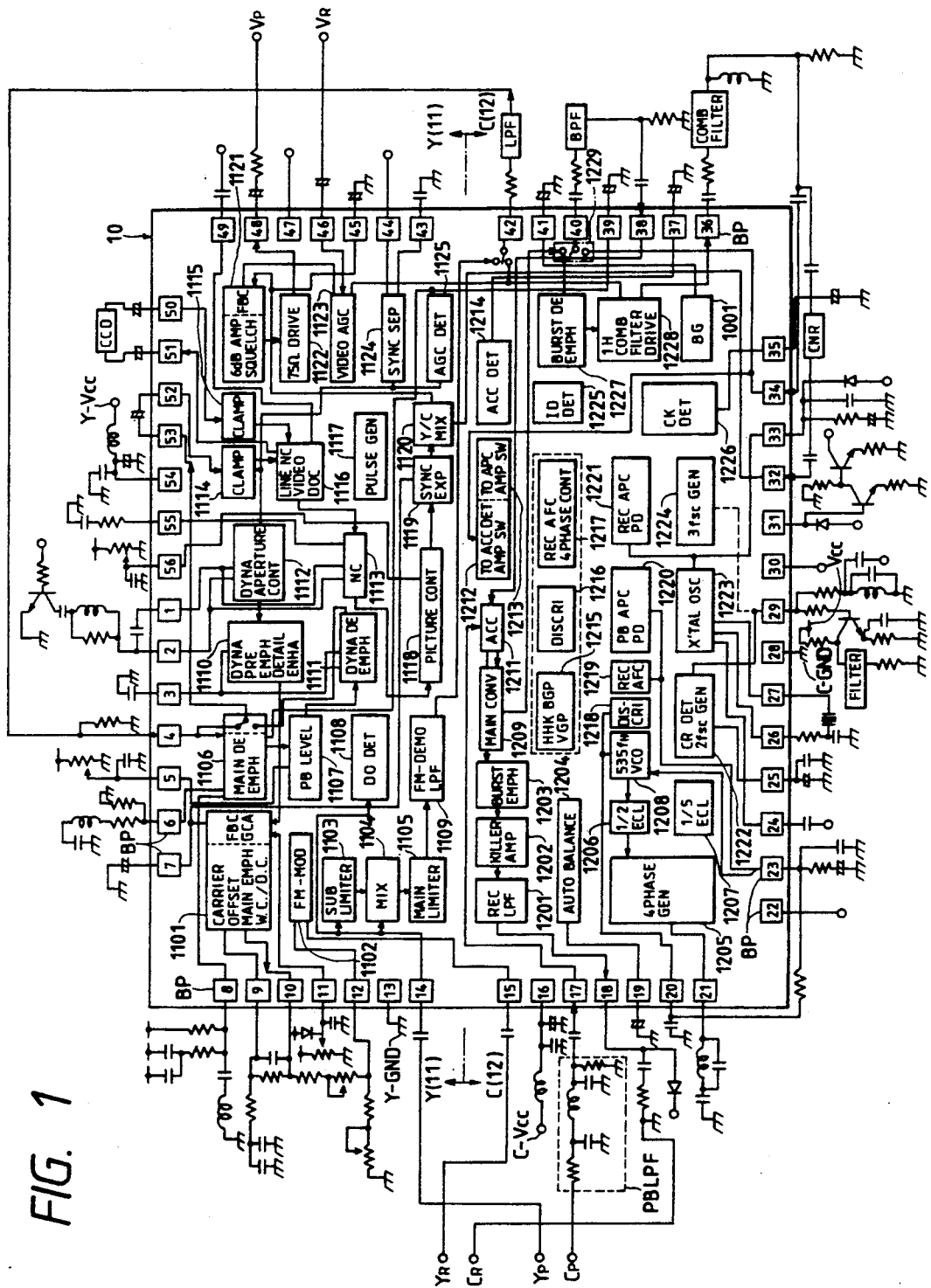
FIG. 1 is a circuit block arrangement diagram of a semiconductor integrated circuit device which is built in a color VTR being Embodiment I of the present invention.
Figure 5:
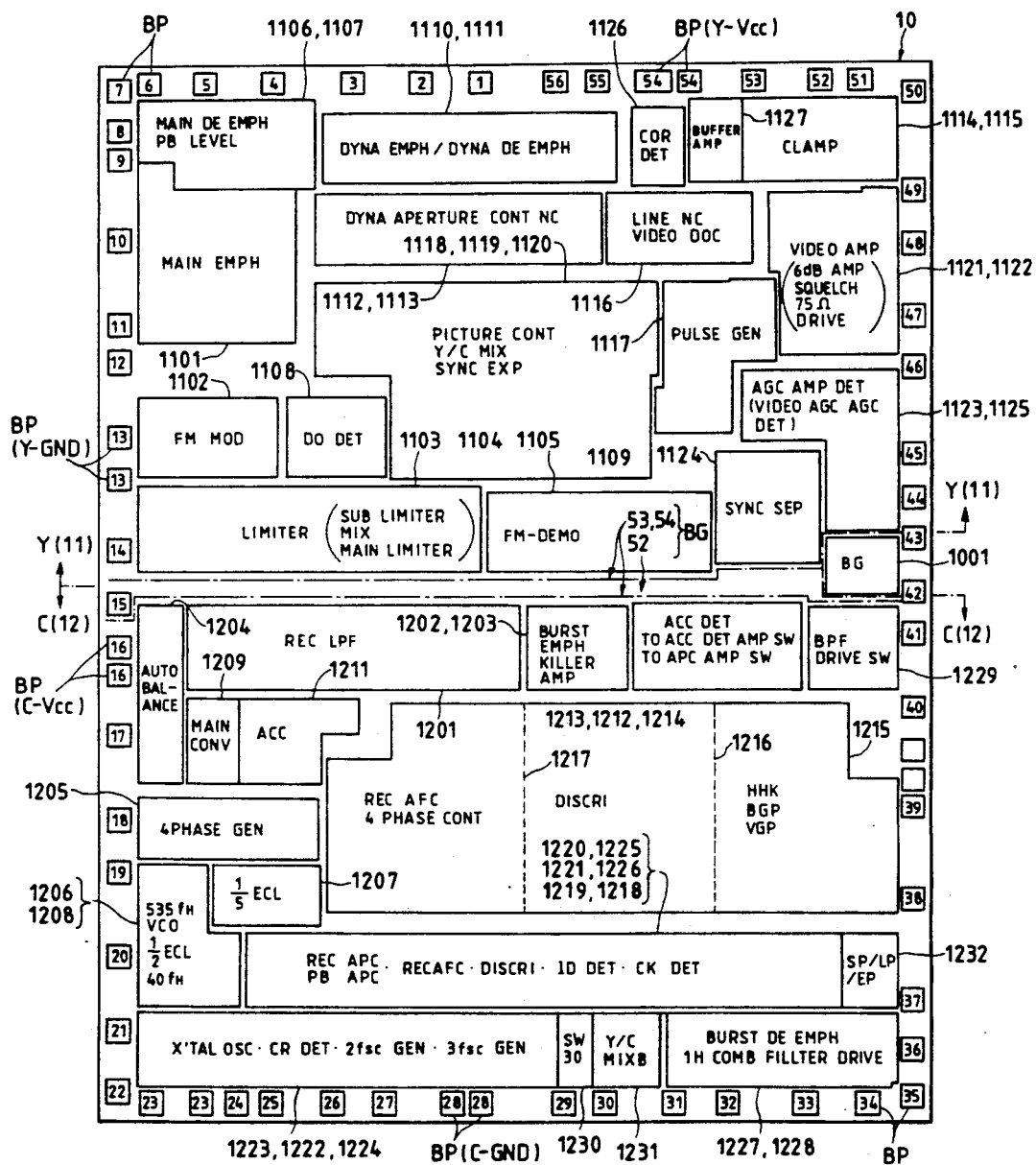
FIGS. 5 thru 7 are chip layout plans of the semiconductor integrated circuit device.

As shown in FIGS. 1 and 5, the semiconductor integrated circuit device 10 includes the luminance signal processing unit (Y signal processing unit) 11 and the color signal processing unit (C signal processing unit) 12. The luminance signal processing unit 11 is situated on the upper side in each of FIGS. 1 and 5. On the other hand, the color signal processing unit 12 is situated on the lower side in each of the figures.

As shown in FIG. 1, the luminance signal processing unit 11 includes the following circuit blocks: Main emphasis circuit 1101, FM-modulator circuit 1102, sub limiter circuit 1103, mixer circuit 1104, and main limiter circuit 1105. Main deemphasis circuit 1106, PB level circuit 1107, dropout detector circuit 1108, FM-demodulator circuit 1109, dynamic emphasis circuit 1110, and dynamic deemphasis circuit 1111. Dynamic aperture control circuit 1112, noise cancel circuit 1113, and clamp circuits 1114, 1115. Line noise cancel circuit 1116, pulse generator circuit 1117, picture control circuit 1118, sync expand circuit 1119, and Y/C mixer circuit 1120, 6-dB amplifying squelch circuit 1121, 75-ohm drive circuit 1122, video AGC circuit 1123, sync separate circuit 1124, and AGC detector circuit 1125.

As shown in FIG. 5, on the principal surface of the semiconductor integrated circuit device 10, the circuit blocks of the luminance signal processing unit 11 are arranged alone or in the form of a collective set consisting of a plurality of circuit blocks. Besides, although not shown in the circuit block arrangement diagram of FIG. 1, the circuit blocks of a correlation detector circuit 1126 and a buffer amplifier circuit 1127 are respectively arranged in the luminance signal processing unit 11 of the semiconductor integrated circuit device 10 as shown in FIG. 5.

On the other hand, the color signal processing unit 12 includes the following circuit blocks as shown in FIG. 1: REC low-pass filter 1201, killer amplifier circuit 1202, burst emphasis circuit 1203, auto balance circuit 1204, and 4-phase signal generator circuit 1205. ½ ECL circuit 1206, 1/5 ECL circuit 1207, 535-$f_H$ VCO circuit 1208, and main converter circuit 1209. ACC circuit 1211, $T_o$ ACC detector amplifier switch circuit 1212, $T_o$ APC amplifier switch circuit 1213, and ACC detector circuit 1214. Burst gate pulse generator circuit 1215, frequency detecting counter circuit 1216, and AFC counter circuit 1217. Discriminator circuit 1218, REC AFC circuit 1219, PB APC circuit 1220, and REC APC circuit 1221. CR time constant control circuit and 2-$f_{sc}$ circuit 1222, crystal oscillator 1223, and 3-$f_{sc}$ circuit 1224. 1-D detector circuit 1225, CK detector circuit 1226, burst deemphasis circuit 1227, 1-H comb filter drive circuit 1228, and BPF drive switch circuit 1229.

Besides, although not shown in FIG. 1, a 40-$f_H$ generator circuit is interposed between the ½ ECL circuit 1206 and the 535-$f_H$ VCO circuit 1208.

Likewise to the circuit blocks of the luminance signal processing unit 11, those of the color signal processing unit 12 are arranged alone or in the form of a collective set consisting of a plurality of circuit blocks, as shown in FIG. 5 on the principal surface of the semiconductor integrated circuit device 10. Besides, although not shown in the circuit block arrangement diagram of FIG. 1, the circuit blocks of a 30-Hz switch detector circuit 1230, a Y/C mixing color bias generator circuit 1231 and an SP/LP/EP detector circuit 1232 are respectively arranged in the color signal processing unit 12 of the semiconductor integrated circuit device 10 as shown in FIG. 5.

Further, a stabilized power source circuit (BG) 1001 is arranged at the boundary part between the luminance signal processing unit 11 and color signal processing unit 12 of the semiconductor integrated circuit device 10 as illustrated in FIG. 5 (arranged on the lower side in FIG. 5). The stabilized power source circuit 1001 is provided as a circuit common to both the luminance signal processing unit 11 and the color signal processing unit 12, and it is shared by both the processing units. It is a D.C. reference voltage generator circuit which generates the D.C. reference supply voltage (3 [V]) stable A.C.-wise.

In addition, external elements (to be externally mounted) which are connected to the external terminals BP of the semiconductor integrated circuit device 10 (resin-encapsulated semiconductor device 20) are as shown in FIG. 1 and shall not be described here.

Now, the circuit operations of the semiconductor integrated circuit device 10 will be briefly described with reference to FIGS. 1 and 5.

Record Operation: REC

First, a color video signal (a luminance signal and a color signal) is received as an input to the color video signal terminal $V_R$ being the pin No. 46 of the semiconductor integrated circuit device 10. The received color video signal is passed through the video AGC circuit 1123, the output of which is delivered to both the pin No. 42 and the 1-H comb filter drive circuit 1228.

The color video signal delivered to the pin No. 42 is passed through the low-pass filter (LPF) externally mounted, thereby to derive only the luminance signal, which is delivered to the pin No. 4. Then, the luminance signal is delivered to the pin No. 52 through the pin No. 53 and the electrolytic capacitor externally mounted. The luminance signal delivered to the pin No. 52 is applied to the pin No. 10 after passing through the clamp circuit 1114, dynamic aperture control circuit 1112, dynamic emphasis circuit 1110 and main emphasis circuit 1101 in succession. The luminance signal delivered to the pin No. 10 is applied to the pin No. 12 through the externally-mounted element. The luminance signal delivered to the pin No. 12 is subjected to FM by the FM-modulator circuit 1102, the frequency-modulated output luminance signal of which is delivered to the luminance signal output terminal $Y_R$ being the pin No. 15.

On the other hand, the color video signal delivered to the 1-H comb filter drive circuit 1228 has only the color signal derived by this circuit, and this color signal is delivered to the pin No. 36. The color signal delivered to the pin No. 36 is applied to the pin No. 34 through the comb filter externally mounted. The color signal delivered to the pin No. 34 is applied to the pin No. 38 after passing through the BPF drive switch circuit 1229, pin No. 40 and externally-mounted band-pass filter (BPF) in succession. The color signal delivered to the pin No. 38 is subjected to frequency conversion by passing through the ACC circuit 1211, main converter circuit 1209, burst emphasis circuit 1203, killer amplifier circuit 1202 and REC low-pass filter circuit 1201 in succession. Then, the frequency-converted color signal is applied to the color signal output terminal $C_R$ being the pin No. 18.

Playback Operation: PB

First, the frequency-modulated luminance signal is received as an input to the luminance signal input terminal $Y_P$ being the pin No. 14 of the semiconductor integrated circuit device 10, while the frequency-converted color signal is received as an input to the color signal input terminal $C_P$ which is coupled to the pin No. 17 through the low-pass filter externally mounted.

The luminance signal applied to the luminance signal input terminal $Y_P$ is subjected to frequency demodulation by passing through the sub limiter circuit 1103, mixer circuit 1104, main limiter circuit 1105 and FM-demodulator circuit 1109 in succession. The frequency-demodulated luminance signal is delivered to the pin No. 42. Then, the luminance signal delivered to the pin No. 42 is applied to the pin No. 4 through the low-pass filter. The luminance signal delivered to the pin No. 4 is applied to the pin No. 53 by passing through the main deemphasis circuit 1106, PB level circuit 1107, dynamic deemphasis circuit 1111 and main deemphasis circuit 1106 in succession. The luminance signal delivered to the pin No. 53 is applied to the pin No. 52 through the electrolytic capacitor externally mounted. The luminance signal delivered to the pin No. 52 is applied to the Y/C mixer circuit 1120 by passing through the clamp circuit 1114, line noise cancel circuit 1116, noise cancel circuit 1113, picture control circuit 1118 and sync expand circuit 1119 in succession.

On the other hand, the color signal applied to the color signal input terminal $C_P$ is subjected to frequency conversin by passing through the ACC circuit 1211 and main converter circuit 1209 in succession. The frequency-converted color signal is delivered to the pin No. 40. The color signal delivered to the pin No. 40 is applied to the pin No. 38 through the band-pass filter. The color signal delivered to the pin No. 38 is applied to the pin No. 36 through the burst deemphasis circuit 1227 and the 1-H comb filter drive circuit 1228. The color signal delivered to the pin No. 36 is applied to the pin No. 32 through the comb filter externally mounted and the color noise reduction circuit (CNR) externally mounted. The color signal delivered to the pin No. 32 is applied to the Y/C mixer circuit 1120.

Both the luminance signal and the color signal delivered to the Y/C mixer circuit 1120 are mixed to generate a color video signal, which is applied as an output to the color video signal terminal $V_P$ being the pin No. 48 through the 6-dB amplifying squelch circuit 1121 and the 75-ohm drive circuit 1122.

In this manner, the luminance signal processing unit 11 and color signal processing unit 12 of the color VTR are respectively constructed in the single semiconductor integrated circuit device 10 (in the principal surface of an identical semiconductor substrate) (that is, both the units are implemented in the form of a 1-chip IC).

Owing to this construction, in contrast to the case where the luminance signal processing unit 11 and the color signal processing unit 12 are respectively constructed as individual semiconductor integrated circuit devices, the shared circuit (the stabilized power source circuit 1001) and the shared external terminals BP (the pins Nos. 18, 22, 30, 31, 32, 41, 44 and 46 totaling eight) can be formed within one chip, and the areas of the shared portions can be contracted to the utmost, so that the density of integration of the semiconductor integrated circuit device 10 can be heightened. As a result, reduction in the size of the color VTR 1 can be attained.

The semiconductor integrated circuit device 10 stated above includes a two-layer wiring structure. Wiring is formed of, for example, aluminum wiring lines or aluminum alloy wiring lines (containing Cu, or both Cu and Si). The layouts of the supply voltage wiring lines of the semiconductor integrated circuit device 10 are shown in FIG. 6 (a chip layout diagram including the layout of the circuit operation supply voltage wiring $V_{CC}$) and FIG. 7 (a chip layout diagram including the layout of the reference supply voltage wiring GND).

Figure 6:
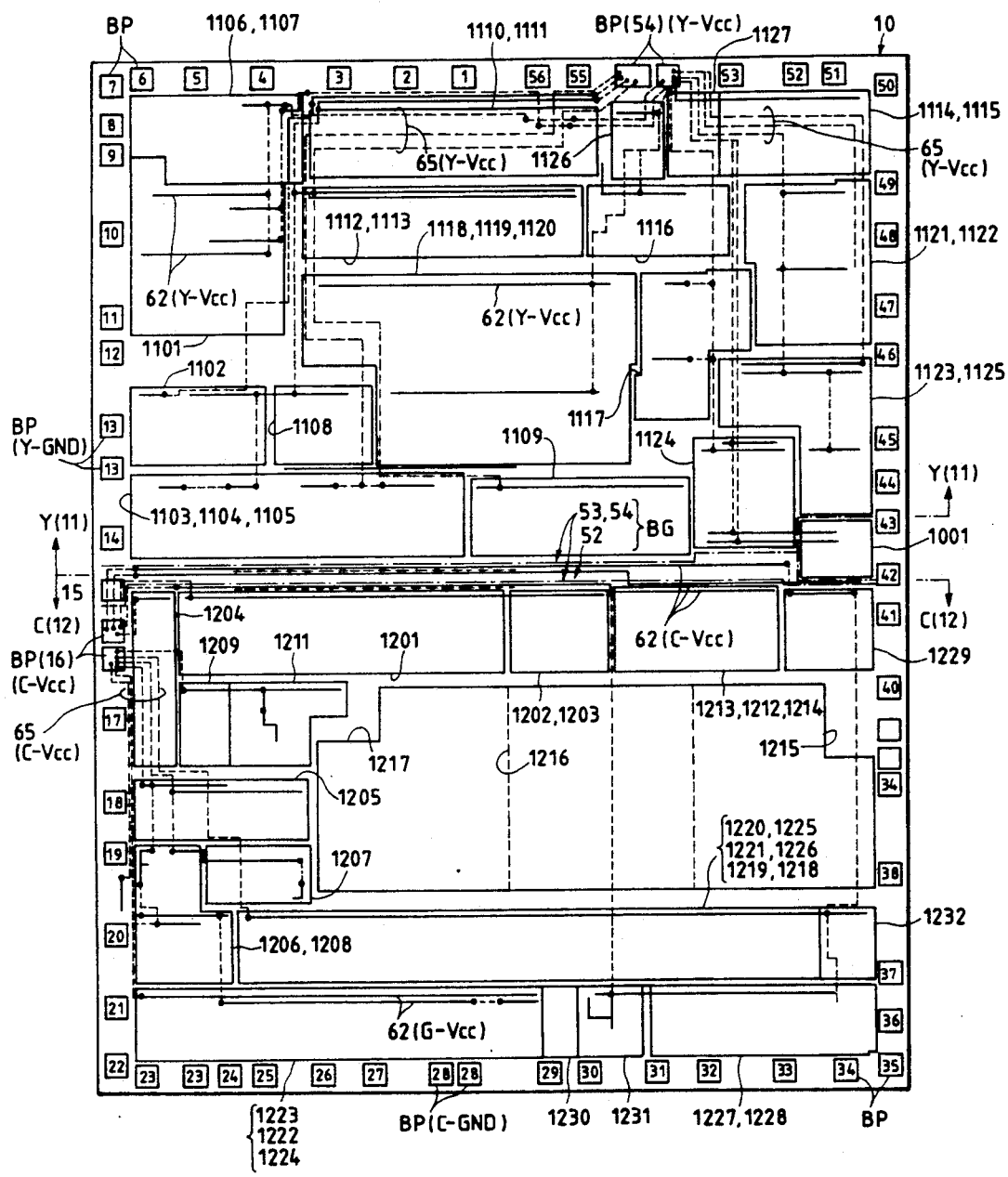

That external terminal BP of the luminance signal processing unit 11 of the semiconductor integrated circuit device 10 to which the circuit operation supply voltage $V_{CC}$ is applied is the pin No. 54 as shown in FIG. 6. This external terminal BP which is fed with the circuit operation supply voltage $V_{CC}$ is divided into two (a plurality of) portions. As shown in FIG. 3 referred to before, the two divisional external terminals BP are respectively connected to one inner lead 21C by interposing the different pieces of bonding wire 22 therebetween. That is, the divisional external terminals BP are respectively connected to the inner lead 21C with a double bonding structure so as to have no common impedance.

Of the external terminals BP to which the circuit operation supply voltage $V_{CC}$ is applied, the right one as viewed in FIG. 6 is chiefly connected to those circuit blocks of the luminance signal processing unit 11 which process the color video signal. The left one is chiefly connected to those circuit blocks of the luminance signal processing unit 11 which process the luminance signal concerning the frequency modulation. The connection between the external terminal BP, which is fed with the circuit operation supply voltage $V_{CC}$, and the circuit blocks is effected through the circuit operation supply voltage wiring lines $V_{CC}$ which are formed by the two-layer wiring structure. In FIG. 6, the circuit operation supply voltage wiring lines $V_{CC}$ formed of the first-layer wiring lines (62) are schematically indicated by solid lines. Likewise, the circuit operation supply voltage wiring lines $V_{CC}$ formed of the second-layer wiring lines (65) are schematically indicated by broken lines. The nodes between the circuit operation supply voltage wiring lines $V_{CC}$ formed of the first-layer wiring lines and those formed of the second-layer wiring lines are schematically indicated by marks · (64).

As shown in FIG. 6, the circuit operation supply voltage wiring lines $V_{CC}$ formed of the first-layer wiring lines are basically laid so as to extend laterally (in an X-direction) at the upper ends (on one-end sides) of the circuit blocks of the luminance signal processing unit 11. Each of the circuit blocks includes about 50–300 semiconductor elements. The circuit operation supply voltage wiring lines $V_{CC}$ formed of the first-layer wiring lines, which are laid at the upper ends of the respective block circuits, have substantially equal pitches vertically (in a Y-direction). Here, in the circuit block which is large or which is vertically long, the circuit operation supply voltage wiring lines $V_{CC}$ formed of the first-layer wiring lines are laid at the upper end and middle level of the circuit block, whereby the pitches of the circuit operation supply voltage wiring lines $V_{CC}$ in the vertical direction are held uniform. That is, the circuit blocks are in the shape of rectangles (squares) whose vertical lateral edges have a predetermined length or a length integral times greater, and the pitches of the circuit operation supply voltage wiring lines $V_{CC}$ in the vertical direction are held uniform on the basis of the array of the circuit blocks.

The circuit operation supply voltage wiring lines $V_{CC}$ formed of the second-layer wiring lines are basically used for connecting the external terminals BP with the circuit operation supply voltage wiring lines $V_{CC}$ formed of the first-layer wiring lines, which are laid at the upper ends of the block circuits. The right one of the two divisional external terminals BP to which the circuit operation supply voltage $V_{CC}$ is applied is connected to the circuit operation supply voltage wiring lines $V_{CC}$ formed of the first-layer wiring lines and laid at the upper ends of the circuit blocks for processing the color video signal, through the circuit operation supply voltage wiring lines $V_{CC}$ formed of the second-layer wiring lines. On the other hand, the left one of the external terminals BP to which the circuit operation supply voltage $V_{CC}$ is applied is connected to the circuit operation supply voltage wiring lines $V_{CC}$ formed of the first-layer wiring lines and laid at the upper ends of the circuit blocks for processing the FM-related luminance signal, through the circuit operation supply voltage wiring lines $V_{CC}$ formed of the second-layer wiring lines.

Both the circuit operation supply voltage wiring lines $V_{CC}$ formed of the first-layer wiring lines and the circuit operation supply voltage wiring lines $V_{CC}$ formed of the second-layer wiring lines are basically laid so as to chiefly extend among the circuit blocks.

Figure 7:
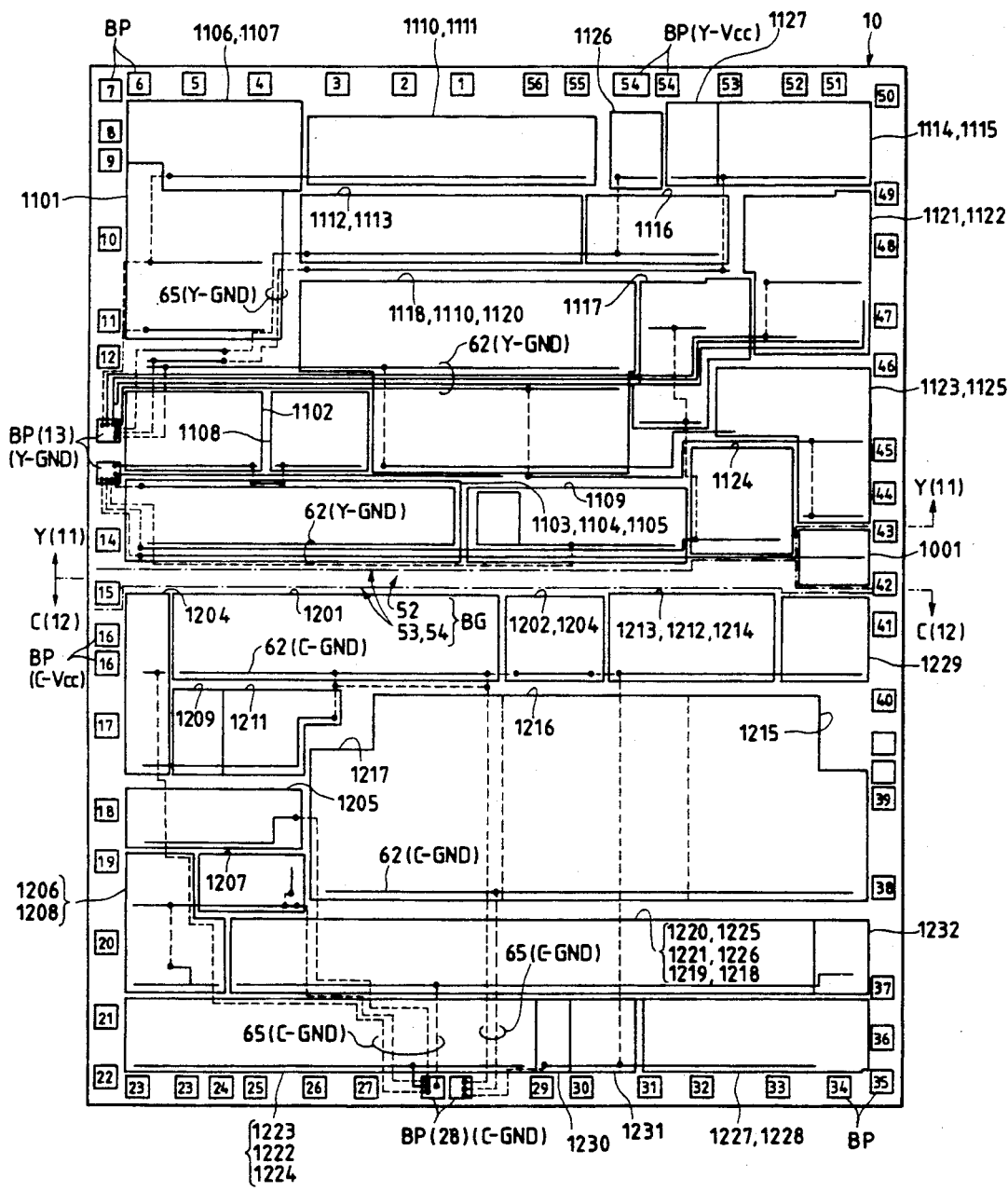

As shown in FIG. 7, that external terminal BP of the luminance signal processing unit 11 of the semiconductor integrated circuit device 10 to which the reference supply voltage GND is applied corresponds to the pin No. 13. Likewise to the external terminal BP to which the circuit operation supply voltage $V_{CC}$ is applied, the external terminal BP to which the reference supply voltage GND is applied is divided into two portions. As illustrated in FIG. 3 referred to before, the two divisional external terminals BP are connected to one inner lead 21C by the double bonding structure.

Of the external terminals BP to which the reference supply voltage GND is applied, the upper one as viewed in FIG. 7 is chiefly connected to those circuit blocks of the luminance signal processing unit 11 which process the color video signal. The lower one is chiefly connected to those circuit blocks of the luminance signal processing unit 11 which process the luminance signal concerning the frequency modulation. The connection between the external terminals BP, to which the reference supply voltage GND is applied, and the circuit blocks is effected through the reference supply voltage wiring lines GND which are formed by the two-layer wiring structure similarly to the circuit operation supply voltage wiring lines $V_{CC}$.

The reference supply voltage wiring lines GND formed of the first-layer wiring lines are basically laid so as to extend laterally at the lower ends (on the other-end sides) of the circuit blocks of the luminance signal processing unit 11. The reference supply voltage wiring lines GND are laid so as to have substantially equal pitches in the vertical direction. Here, in the circuit block which is large or which is vertically long, the reference supply voltage wiring lines GND formed of the first-layer wiring lines are laid at the lower end and middle level of the circuit block, whereby the pitches of the reference supply voltage wiring lines GND in the vertical direction are held uniform.

The reference supply voltage wiring lines GND formed of the second-layer wiring lines are basically used for connecting the reference supply voltage wiring lines GND formed of the first-layer wiring lines, which are laid at the lower ends of the block circuits arranged in the vertical direction. The upper one and lower one of the two divisional external terminals BP to which the reference supply voltage GND is applied are respectively connected to the circuit blocks for processing the FM-related luminance signal and the circuit blocks for processing the color video signal, through the reference supply voltage wiring lines GND formed of the first-layer wiring lines and led out independently of one another (so as to have no common impedance).

Likewise to the circuit operation supply voltage wiring lines $V_{CC}$, the reference supply voltage wiring lines GND formed of the first-layer and second-layer wiring lines are basically laid so as to chiefly extend among the circuit blocks.

As shown in FIG. 6, that external terminal BP of the color signal processing unit 12 of the semiconductor integrated circuit device 10 to which the circuit operation supply voltage $V_{CC}$ is applied corresponds to the pin No. 16. Likewise to the external terminal BP of the luminance signal processing unit 11, the external terminal BP to which the circuit operation supply voltage $V_{CC}$ is applied is divided into two portions. As illustrated in FIG. 3 referred to before, the two divisional external terminals BP are connected to one inner lead 21C by the double bonding structure.

Of the external terminals BP to which the circuit operation supply voltage $V_{CC}$ is applied, the upper one as viewed in FIG. 6 is chiefly connected to those circuit blocks (to be described in detail later) of the color signal processing unit 12 which process the main signal of the color signal. The lower one is chiefly connected to those circuit blocks of the control loop of the color signal processing unit 12 which process the main signal of the color signal. The connection between the external terminals BP, to which the circuit operation supply voltage $V_{CC}$ is applied, and the circuit blocks is effected through the circuit operation supply voltage wiring lines $V_{CC}$ which are formed by the two-layer wiring structure, similarly to the connection in the luminance signal processing unit 11.

The circuit operation supply voltage wiring lines $V_{CC}$ formed of the first-layer wiring lines are basically laid so as to extend laterally at the upper ends (on one-end sides) of the circuit blocks of the color signal processing unit 12. They have substantially equal pitches in the vertical direction.

The circuit operation supply voltage wiring lines $V_{CC}$ formed of the second-layer wiring lines are basically used for connecting the circuit operation supply voltage wiring lines $V_{CC}$ formed of the first-layer wiring lines, which are laid at the upper ends of the block circuits arranged in the verical direction. The upper one and lower one of the two divisional external terminals BP to which the circuit operation supply voltage $V_{CC}$ is applied are respectively connected to the circuit operation supply voltage wiring lines $V_{CC}$ formed of the first-layer wiring lines in the circuit blocks for processing the main signal of the color signal and those formed of the first-layer wiring lines in the circuit blocks of the control loop for processing the main signal of the color signal, through the circuit operation supply voltage wiring lines $V_{CC}$ formed of the second-layer wiring lines and led out independently of one another.

Likewise to those of the luminance signal processing unit 11, the circuit operation supply voltage wiring lines $V_{CC}$ formed of the first-layer and second-layer wiring lines are basically laid so as to chiefly extend among the circuit blocks.

As shown in FIG. 7, that external terminal BP of the color signal processing unit 12 of the semiconductor integrated circuit device 10 to which the reference supply voltage GND is applied corresponds to the pin No. 28. Likewise to the external terminal BP of the luminance signal processing unit 11, the external terminal BP to which the reference supply voltage GND is applied is divided into two portions. As illustrated in FIG. 3 referred to before, the two divisional external terminals BP are connected to one inner lead 21C by the double bonding structure.

Of the external terminals BP to which the reference supply voltage GND is applied, the right one as viewed in FIG. 7 is chiefly connected to those circuit blocks of the color signal processing unit 12 which process the main signal of the color signal. The left one is chiefly connected to those circuit blocks of the control loop of the color signal processing unit 12 which process the main signal of the color signal. The connection between the external terminals BP, to which the reference supply voltage GND is applied, and the circuit blocks is effected through the reference supply voltage wiring lines GND which are formed by the two-layer wiring structure, similarly to the connection in the luminance signal processing unit 11.

The reference supply voltage wiring lines GND formed of the first-layer wiring lines are basically laid so as to extend laterally at the lower ends (on the other-end sides) of the circuit blocks of the color signal processing unit 12. They have substantially equal pitches in the vertical direction.

The reference supply voltage wiring lines GND formed of the second-layer wiring lines are basically used for connecting the external terminals BP and the reference supply voltage wiring lines GND formed of the first-layer wiring lines, which are laid at the lower ends of the block circuits arranged in the vertical direction. The right one and left one of the two divisional external terminals BP to which the reference supply voltage GND is applied are respectively connected to the reference supply voltage wiring lines GND formed of the first-layer wiring lines in the circuit blocks for processing the main signal of the color signal and those formed of the first-layer wiring lines in the circuit blocks of the control loop for processing the main signal of the color signal, through the reference supply voltage wiring lines GND formed of the second-layer wiring lines and led out independently of one another.

Likewise to those of the luminance signal processing unit 11, the reference supply voltage wiring lines GND formed of the first-layer and second-layer wiring lines are basically laid so as to chiefly extend among the circuit blocks.

In this manner, in a semiconductor integrated circuit device 10, a luminance signal processing unit 11 and a color signal processing unit 12 for a color VTR 1 are respectively constructed in the regions of the principal surface of an identical semiconductor substrate different from each other, and circuit operation supply voltage wiring lines $V_{CC}$ which are led in from an external terminal BP (pin No. 54) fed with a circuit operation supply voltage $V_{CC}$, as well as reference supply voltage wiring lines GND which are led in from an external terminal BP (pin No. 13) fed with a reference supply voltage GND are respectively laid in the luminance signal processing unit 11, while circuit operation supply voltage wiring lines $V_{CC}$ which are led in from an external terminal BP (pin No. 16) fed with the circuit operation supply voltage $V_{CC}$ and differing from the external terminal BP of the luminance signal processing unit 11, as well as reference supply voltage wiring lines GND which are led in from an external terminal BP (pin No. 28) fed with the reference supply voltage GND are respectively laid in the color signal processing unit 12. Owing to this construction, as compared with a case where the luminance signal processing unit 11 and the color signal processing unit 12 are respectively constructed in the principal surfaces of individual semiconductor substrates, the implementation in the shape of one chip can contract especially the area of shared portions to the utmost, so that the density of integration of the semiconductor integrated circuit device 10 can be heightened. Simultaneously, the circuit operation supply voltage wiring lines $V_{CC}$ and reference supply voltage wiring lines GND of the luminance signal processing unit 11 and the circuit operation supply voltage wiring lines $V_{CC}$ and reference supply voltage wiring lines GND of the color signal processing unit 12 have no common impedance among them, so that the crosstalk oscillation phenomenon between the luminance signal of the luminance signal processing unit 11 and the color signal of the color signal processing unit 12 can be relieved to reduce noise which develops in both the luminance signal and the color signal. The reduction of the noise to develop in both the luminance signal and the color signal can enhance the picture quality of the color picture of the color VTR 1.

In addition, that external terminal BP of the luminance signal processing unit 12 to which the circuit operation supply voltage $V_{CC}$ is applied is divided into a plurality of external terminals, from which the circuit operation supply voltage wiring lines $V_{CC}$ are respectively led in, and that external terminal BP of the luminance signal processing unit 11 to which the reference supply voltage GND is applied is divided into a plurality of external terminals BP, from which the reference supply voltage wiring lines GND are led in, while that external terminal BP of the color signal processing unit 12 to which the circuit operation supply voltage $V_{CC}$ is applied is divided into a plurality of external terminals BP, from which the circuit operation supply voltage wiring lines $V_{CC}$ are respectively led in, and that external terminal BP of the color signal processing unit 12 to which the reference supply voltage GND is applied is divided into a plurality of external terminals BP, from which the reference supply voltage wiring lines GND are led in. Owing to this construction, common impedances can be reduced among the circuit operation supply voltage wiring lines $V_{CC}$ of the luminance signal processing unit 11 and among the reference supply voltage wiring lines GND thereof, and among the circuit operation supply voltage wiring lines $V_{CC}$ of the color signal processing unit 12 and among the reference supply voltage wiring lines GND thereof, so that noise to develop in both the luminance signal and the color signal can be reduced still more.

Besides, at the boundary part between the luminance signal processing unit 11 and the color signal processing unit 12, there are laid both the reference supply voltage wiring lines GND led in from that external terminal (the pin No. 13) of the luminance signal processing unit 11 to which the reference supply voltage GND is applied, and the circuit operation supply voltage wiring lines $V_{CC}$ led in from that external terminal BP (the pin No. 16) of the color signal processing unit 12 to which the circuit operation supply voltage $V_{CC}$ is applied. Owing to this construction, the crosstalk oscillation phenomenon between the luminance signal of the luminance signal processing unit 11 and the color signal of the color signal processing unit 12 can be relieved by the reference supply voltage wiring lines GND of the luminance signal processing unit 11 and the independent, circuit operation supply voltage wiring lines $V_{CC}$ of the color signal processing unit 12 having no common impedance with the former, so that noise to develop in both the luminance signal and the color signal can be reduced still more.

Moreover, although no illustration is made in FIGS. 6 and 7, the semiconductor integrated circuit device 10 is such that the external terminal BP of the luminance signal processing unit 11 fed with the circuit operation supply voltage $V_{CC}$ is divided into two external terminals BP, and that the two divisional external terminals BP are short-circuited through the circuit operation supply voltage wiring lines $V_{CC}$ respectively led in therefrom and at, for example, the distal ends of these wiring lines. Likewise, the external terminal BP of the luminance signal processing unit 11 fed with the reference supply voltage GND is divided into two external terminals BP, and the two divisional external terminals BP are short-circuited through the reference supply voltage wiring lines GND respectively led in therefrom. The external terminal BP of the color signal processing unit 12 fed with the circuit operation supply voltage $V_{CC}$ is divided into two external terminals BP, and the two divisional external terminals BP are short-circuited through the circuit operation supply voltage wiring lines $V_{CC}$ respectively led in therefrom. The external terminal BP of the color signal processing unit 12 fed with the reference supply voltage GND is divided into two external terminals BP, and the two divisional external terminals BP are short-circuited through the reference supply voltage wiring lines GND respectively led in therefrom.

In this manner, one and another of those plurality of divisional external terminals BP of the luminance signal processing unit 11 to which the circuit operation supply voltage $V_{CC}$ is applied are short-circuited through the circuit operation supply voltage wiring lines $V_{CC}$ respectively led in therefrom, one and another of those plurality of divisional external terminals BP of the luminance signal processing unit 11 to which the reference supply voltage GND is applied are short-circuited through the reference supply voltage wiring lines GND respectively led in therefrom, one and another of those plurality of divisional external terminals BP of the color signal processing unit 12 to which the circuit operation supply voltage $V_{CC}$ is applied are short-circuited through the circuit operation supply voltage wiring lines $V_{CC}$ respectively led in therefrom, and one and another of those plurality of divisional external terminals BP of the color signal processing unit 12 to which the reference supply voltage GND is applied are short-circuited through the reference supply voltage wiring lines GND respectively led in therefrom. Owing to this construction, in probing the characteristics of the semiconductor integrated circuit device 10, the contact resistance between a probe and one external terminal BP can be canceled by the contact resistance between another probe and another external terminal BP, so that the accuracy of the characteristics probing can be enhanced.

As shown in FIGS. 5 thru 7, in a semiconductor integrated circuit device 10, a luminance signal processing unit 11 and a color signal processing unit 12 for a color VTR 1, each unit including a plurality of circuit blocks, are respectively constructed in the regions of the principal surface of an identical semiconductor substrate different from each other, and circuit operation supply voltage wiring lines (first-layer wiring lines) $V_{CC}$ are laid on the one-end sides of the respective circuit blocks of the luminance signal processing unit 11 and the color signal processing unit 12, while reference supply voltage wiring lines (first-layer wiring lines) GND are laid on the other-end sides of the circuit blocks. Owing to this construction, as compared with a case where the luminance signal processing unit 11 and the color signal processing unit 12 are respectively constructed in the principal surfaces of individual semiconductor substrates, the implementation in the shape of one chip can contract especially the area of shared portions to the utmost, so that the density of integration of the semiconductor integrated circuit device 10 can be heightened. Simultaneously, the connection between the circuit operation supply voltage wiring lines $V_{CC}$ of the respective circuit blocks, the connection between the reference supply voltage wiring lines GND of the respective circuit blocks, and the connection between the circuit operation supply voltage wiring line and the reference supply voltage wiring line can be effected with the shortest distances, and the lengths to-be-led-about of the circuit operation supply voltage wiring lines $V_{CC}$ and the reference supply voltage wiring lines GND for connecting the respective circuit blocks can be decreased, so that the density of integration of the semiconductor integrated circuit device 10 can be heightened still more in correspondence with the decrease of the lengths to-be-led-about of the supply voltage wiring lines.

In addition, at the boundary part between the luminance signal processing unit 11 and the color signal processing unit 12, there are laid the reference supply voltage wiring lines GND on the lower-end sides of the circuit blocks of the luminance signal processing unit 11 and the circuit operation supply voltage wiring lines $V_{CC}$ on the upper-end sides of the circuit blocks of the color signal processing unit 12. This layout is natural because the circuit operation supply voltage wiring lines $V_{CC}$ and the reference supply voltage wiring lines GND are respectively laid on the upper-end sides and lower-end sides of the respective circuit blocks. Incidentally, the above layout is reversed in case of laying the reference supply voltage wiring lines GND and the circuit operation supply voltage wiring lines $V_{CC}$ on the upper-end sides and lower-end sides of the circuit blocks, respectively. Owing to this construction, the crosstalk oscillation phenomenon between the luminance signal of the luminance signal processing unit 11 and the color signal of the color signal processing unit 12 can be relieved by the reference supply voltage wiring lines GND of the circuit blocks of the luminance signal processing unit 11 and the independent, circuit operation supply voltage wiring lines $V_{CC}$ of the circuit blocks of the color signal processing unit 12 having no common impedance with the former, so that noise to develop in both the luminance signal and the color signal can be reduced.

Moreover, the semiconductor integrated circuit device 10 is constructed in which the circuit operation supply voltage wiring lines $V_{CC}$ and the reference supply voltage wiring lines GND are respectively laid on the upper-end sides and lower-end sides of the circuit blocks in this manner, and it is sealed with a resin mold 23 into a resin-encapsulated semiconductor device 20 as shown in FIG. 3. Owing to this construction, currents to flow through all the circuit blocks of both the luminance signal processing unit 11 and the color signal processing unit 12 arranged in the semiconductor integrated circuit device 10 can be brought into substantially one direction from the circuit operation supply voltage wiring lines $V_{CC}$ of the upper-end sides to the reference supply voltage wiring lines GND of the lower-end sides through semiconductor elements. As a result, the magnitudes of fluctuations in the piezoelectric effect attributed to stresses appearing after the resin encapsulation can be rendered uniform in all the circuit blocks, so that the circuit operation margins of the processing units can be widened to enhance the available percentage of the resin-encapsulated semiconductor device 20 in the production thereof. As will be described later, this effect is remarkably demonstrated in resistors which are included in the semiconductor integrated circuit device 10. Accordingly, all the resistors included in the semiconductor integrated circuit device 10 are oriented so that their resistance length directions may become identical in order to hold the unidirectional current flows.

The semiconductor integrated circuit device 10 is formed by a design technique close to the building block method of the gate array method, in which the circuit blocks of both the luminance signal processing unit 11 and the color signal processing unit 12 are assembled by utilizing the CAD. This semiconductor integrated circuit device 10 is adapted to readily alter the allocated positions of the individual circuit blocks and to shorten a period of time for development to the utmost.

Now, the practicable sectional structures of the semiconductor elements included in the semiconductor integrated circuit device 10 stated above will be briefly described with reference to FIGS. 8(A) thru 8(D) (sectional views of essential portions).

As shown in FIGS. 8(A) thru 8(D), the semiconductor integrated circuit device 10 includes a $p^-$-type semiconductor substrate 50 made of single-crystal silicon. The $p^-$-type semiconductor substrate 50 exhibits a specific resistance of, for example, about 20–30 [ohms-cm]. An $n^-$-type epitaxial layer 51 which serves as an element forming layer (an active layer) is provided on the principal surface of the $p^-$-type semiconductor substrate 50. By way of example, the $n^-$-type epitaxial layer 51 is formed so as to have a thickness of about 4–5 [$\mu$m] and an impurity density on the order of $10^{15}$–$10^{16}$ [atoms/cm$^3$]. Although the $p^-$-type semiconductor substrate 50 is illustrated as individual and separate parts in FIGS. 8(A) thru 8(D) on account of limited space, actually the parts form one substrate.

Bipolar transistors Tr1–Tr4, resistors R1, R2 and capacitors C1, C2 are mainly included in the semiconductor integrated circuit device 10.

Figure 8A:
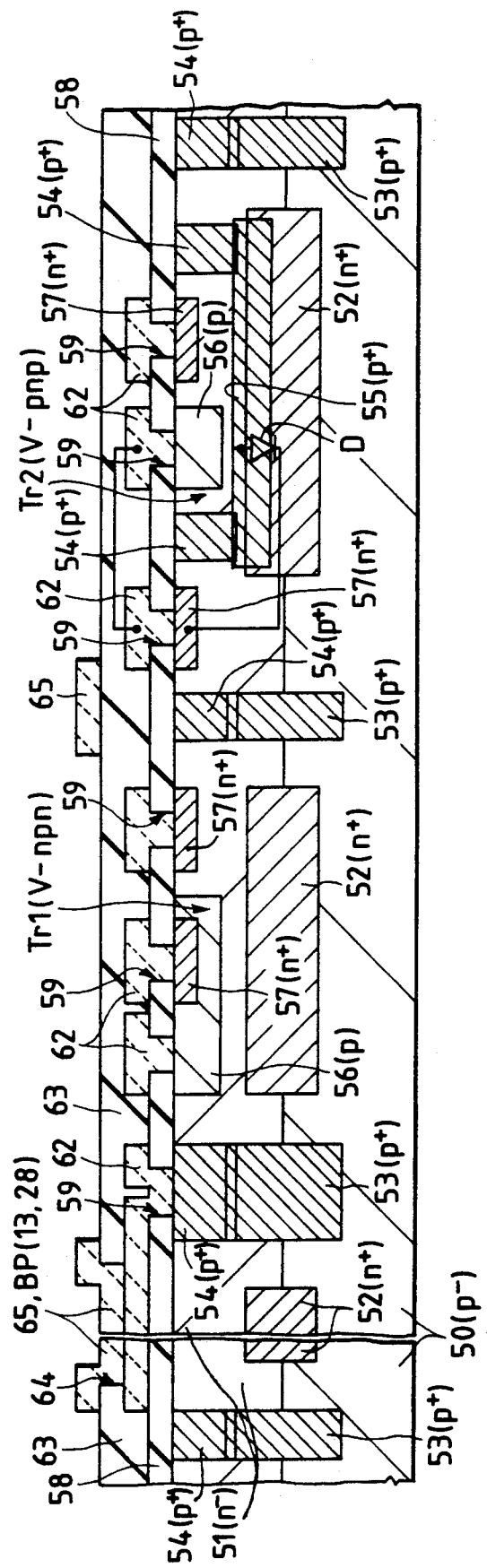
FIGS. 8(A) thru 8(D) are sectional views of the essential portions of the semiconductor integrated circuit device.

As shown in FIG. 8(A), the bipolar transistor Tr1 has an n-p-n construction of vertical structure. It constitutes each of the circuit blocks, output stage circuits, etc. of the luminance signal processing unit 11 and the color signal processing unit 12.

The bipolar transistor Tr1 is so constructed that an n-type collector region, a p-type base region and an n-type emitter region are vertically arrayed within an active island region which is surrounded with an element isolation region.

The element isolation region includes the $p^-$-type semiconductor substrate 50, a $p^+$-type semiconductor region 53 and a $p^+$-type semiconductor region 54. The $p^+$-type semiconductor region 53 is provided so as to vertically cross parts of the $p^-$-type semiconductor substrate 50 and the $n^-$-type epitaxial layer 51. The $p^+$-type semiconductor region 54 is extended in the depthwise direction of the $n^-$-type epitaxial layer 51 from the principal surface thereof, and its bottom is connected to the upper side of the $p^+$-type semiconductor region 53. Both the $p^+$-type semiconductor regions 53 and 54 are formed at an impurity density on the order of, for example, $10^{18}$ [atoms/cm$^3$]. The element isolation region is connected through a reference supply voltage wiring line (GND) 62 with an external terminal (the pin No. 13 or No. 28: BP) 65 to which the reference supply voltage is applied, and it is fed with the reference supply voltage GND.

The reference supply voltage wiring line 62 is formed of the first-layer wiring line of, for example, aluminum alloy and at a film thickness of, for example, about 1 [μm]. The one-end side of the reference supply voltage wiring line 62 is connected to the front surface of the $p^+$-type semiconductor region 54 of the element isolation region through a contact hole 59 which is formed in an inter-layer insulator film 58. The other-end side of the reference supply voltage wiring line 62 is connected to the external terminal 65 through a contact hole 64 which is formed in an inter-layer insulator film 63. The external terminal 65 is formed of the second-layer wiring line of, for example, aluminum alloy and at a film thickness of, for example, about 1 [μm].

The n-type collector region of the bipolar transistor Tr1 includes the $n^-$-type epitaxial layer 51, a buried $n^+$-type semiconductor region 52 and an $n^+$-type semiconductor region 57. The buried $n^+$-type semiconductor region 52 is provided so as to vertically cross parts of the $p^-$-type semiconductor substrate 50 and the $n^-$-type epitaxial layer 51, and it is formed at an impurity density on the order of, for example, $10^{18}$–$10^{19}$ [atoms/cm$^3$]. The $n^+$-type semiconductor region 57 is formed in order to raise the collector potential of the transistor Tr1, and it is provided in the principal surface part of the $n^-$-type epitaxial layer 51. It is formed at an impurity density on the order of, for example, $10^{19}$–$10^{20}$ [atoms/cm$^3$].

The p-type base region includes a p-type semiconductor region 56, which is formed at an impurity density on the order of, for example, $10^{18}$–$10^{19}$ [atoms/cm$^3$]. The p-type semiconductor region 56 is provided in the principal surface part of the $n^-$-type epitaxial layer 51.

The n-type emitter region includes another $n^+$-type semiconductor region 57. This $n^+$-type semiconductor region 57 is provided in the principal surface part of the p-type semiconductor region 56.

The first-layer wiring lines 62 are respectively connected to the $n^+$-type semiconductor region 57 of the n-type collector region, the p-type semiconductor region 56 of the p-type base region and the $n^+$-type semiconductor region 57 of the n-type emitter region.

As shown in FIG. 8(A), the bipolar transistor Tr2 has a p-n-p construction of vertical structure. Likewise to the bipolar transistor Tr1, the bipolar transistor Tr2 constitutes each of the circuit blocks, output stage circuits, etc. of the luminance signal processing unit 11 and the color signal processing unit 12.

The bipolar transistor Tr2 is so constructed that a p-type collector region, an n-type base region and a p-type emitter region are vertically arrayed within an active region which is surrounded with the element isolation region.

The p-type collector region of the bipolar transistor Tr2 mainly includes a buried $p^+$-type semiconductor region 55 and a $p^+$-type semiconductor region 54. The buried $p^+$-type semiconductor region 55 is formed at an impurity density on the order of, for example, $10^{18}$ [atoms/cm$^3$]. It is provided so as to vertically cross parts of the $n^-$-type epitaxial layer 51 and a buried $n^+$-type semiconductor region 52. The buried $n^+$-type semiconductor region 52 functions to isolate the buried $p^+$-type semiconductor region 55 constituting the p-type collector region from the $p^-$-type semiconductor substrate 50. Although no illustration is made, the buried $p^+$-type semiconductor region 55 constituting the p-type collector region is connected to the first-layer wiring line 62 through the $p^+$-type semiconductor region 54 (constituting the p-type collector region).

The n-type base region mainly includes the $n^-$-type epitaxial layer 51. The $n^-$-type epitaxial layer 51 is defined within a region surrounded with the buried $p^+$-type semiconductor region 55 and the $p^+$-type semiconductor region 54 which constitute the p-type collector region, in a manner to be isolated from any other region. Although no illustration is made in FIG. 8(A), the n-type base region is formed at a somewhat higher impurity density on its side closer to the p-type emitter region, and the impurity density is on the order of, for example, $10^{17}$ [atoms/cm$^3$]. The increase of the impurity density is intended to control the current gain ($h_{FE}$) of the bipolar transistor Tr2. The $n^-$-type epitaxial layer 51 constituting the n-type base region is connected to the first-layer wiring line 62 through an $n^+$-type semiconductor region 57.

The p-type emitter region includes a p-type semiconductor region 56. The p-type semiconductor region 56 is connected to the first-layer wiring line 62.

Both the bipolar transistors Tr1 and Tr2 shown in FIG. 8(A) constitute the output stage circuit of the 75-ohm drive circuit 1122 of the luminance signal processing unit 11 of the semiconductor integrated circuit device 10. The structure of this output stage circuit is shown in FIG. 9 (an equivalent circuit diagram) and FIG. 10 (a plan view of essential portions).

Figure 10:
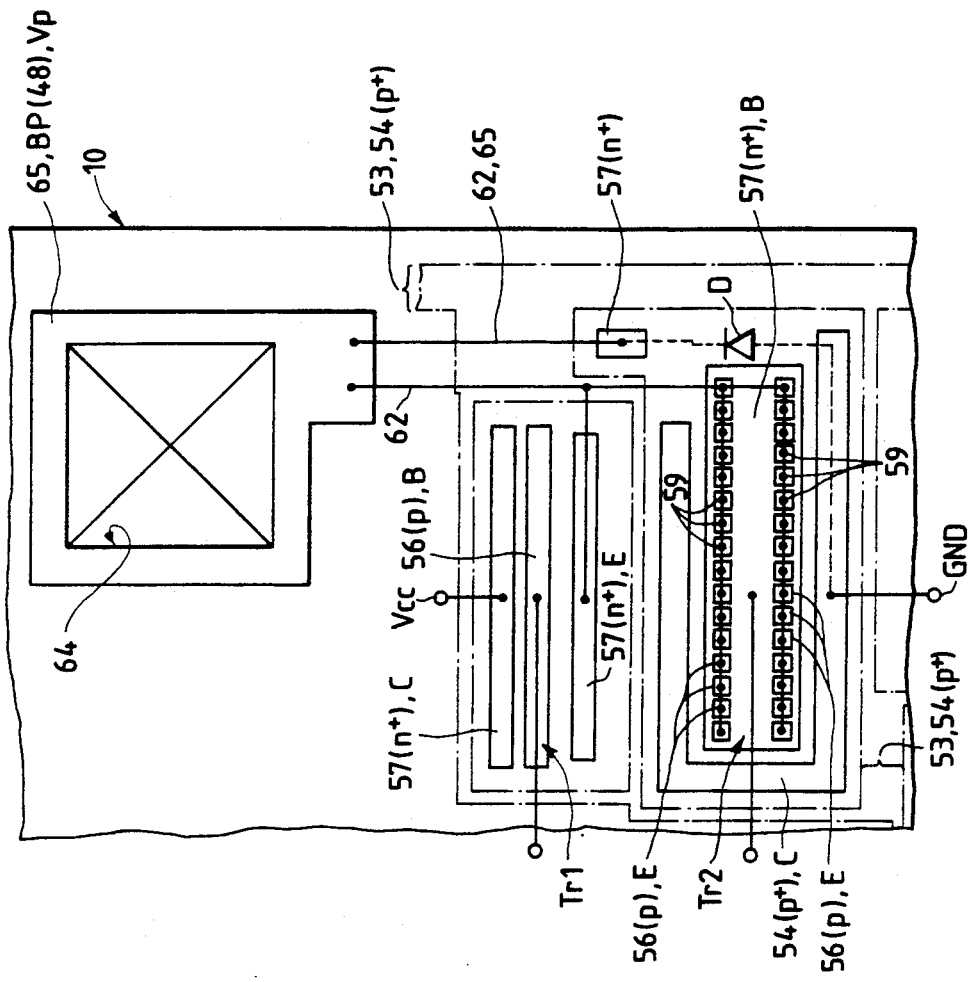
FIG. 10 is a plan view of the essential portions of the output stage circuit.
Figure 9:
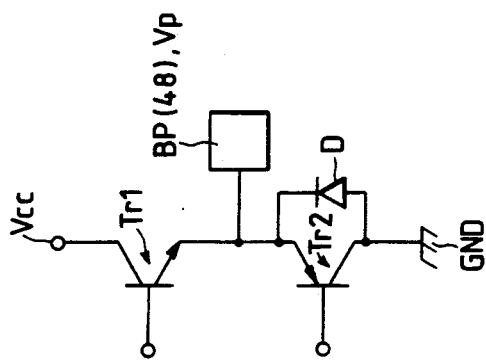
FIG. 9 is an equivalent circuit diagram of the output stage circuit of the semiconductor integrated circuit device.

As illustrated in FIGS. 9 and 10, the output stage circuit includes a push-pull circuit in which the n-p-n bipolar transistor of vertical structure Tr1 and the p-n-p bipolar transistor of vertical structure Tr2 are connected in series with each other. The push-pull circuit is provided with the p-n-p bipolar transistor of vertical structure Tr2 for the purpose of enhancing a cutoff frequency ($f_T$).

As shown in FIG. 9, the bipolar transistor Tr2 has the emitter region E connected to the external terminal (the pin No. 48) BP. It is provided with a diode element D in parallel across the emitter region E and the collector region C. The diode element D has its anode region side connected to the collector region C, and its cathode side region connected to the emitter region E. As shown in FIG. 8(A), this diode element D includes as its anode region the buried p+-type semiconductor region 55 which constitutes the p-type collector region of the bipolar transistor Tr2. Besides, it includes as its cathode region the buried n+-type semiconductor region 52 which isolates the p-type collector region and the p−-type semiconductor substrate 50. As shown in FIGS. 8(A) and 10, the buried n+-type semiconductor region 52 constituting the cathode region of the diode element D is provided for a terminal with the n−-type epitaxial layer 51 as well as another n+-type semiconductor region 57 connected thereto, and it is once led out through the terminal to the first-layer wiring line 62, through which it is connected to the emitter region E of the bipolar transistor Tr2.

The p-n junction of the diode element D is formed of the p-n junction between the buried p+-type semiconductor region 55 and the buried n+-type semiconductor region 52, namely, the junction between the semiconductor regions both having the high impurity densities. In contrast, the p-n junction between the p-type emitter region E (p-type semiconductor region 56) and the n-type base region B (n−-type epitaxial layer 51) of the bipolar transistor Tr2 is formed of the junction between the semiconductor regions both having the somewhat low impurity densities. That is, the p-n junction breakdown voltage of the diode element D is set to be lower as compared with the p-n junction breakdown voltage between the p-type emitter region E and the n-type base region B of the bipolar transistor Tr2. In a case where an excess current incurring electrostatic breakdown has been applied to the external terminal (BP) 65, the diode element D bypasses the excess current from the p-type emitter region E to the p-type collector region C before the breakdown of the p-n junction between the p-type emitter region E and n-type base region B of the bipolar transistor Tr2. The bypassed excess current is absorbed by the reference supply voltage GND. According to the inventor's measurement, the output stage circuit had the electrostatic breakdown voltage raised about 50–100 [V] by the insertion of the diode element D, with the result that an electrostatic breakdown voltage value of or above about 200 [V] could be attained.

In this manner, in a semiconductor integrated circuit device 10 wherein the p-type emitter region E (p-type semiconductor region 56) of a p-n-p bipolar transistor of vertical structure Tr2 constituting an output stage circuit is connected to an external terminal (BP: pin No. 48) 62, a diode element D is interposed between the p-type emitter region E and n-type collector region C (buried p+-type semiconductor region 55) of the p-n-p bipolar transistor of vertical structure Tr2 of the output stage circuit, the diode element D having a junction breakdown voltage lower than the p-n junction breakdown voltage between the p-type emitter region E and n-type base region B (n−-type epitaxial layer 51) of the p-n-p bipolar transistor Tr2 and having its anode region side and its cathode region side connected to the p-type collector region C and the p-type emitter region E, respectively. Owing to this construction, in a case where an excess current incurring electrostatic breakdown has been applied to an external terminal BP, it can be absorbed to the side of a reference supply voltage GND through the diode element D, so that the breakdown of the p-n junction between the p-type emitter region E and n-type base region B of the p-n-p bipolar transistor of vertical structure Tr2 can be prevented to enhance the electrostatic breakdown voltage thereof.

In addition, the cathode region of the diode element D includes a buried n+-type semiconductor region 52. Owing to this construction, the cathode region of the diode element D can be formed by the same step as that of the collector region of a bipolar transistor Tr1 or the isolation region of the bipolar transistor Tr2, so that the number of steps for forming the diode element D can be decreased.

Further, the p-n-p bipolar transistor of vertical structure Tr2 of the output stage circuit constitutes a parasitic thyristor structure along with a parasitic p-n-p bipolar transistor of vertical structure. The parasitic p-n-p bipolar transistor of vertical structure includes as its p-type emitter region the buried p+-type semiconductor region 55 which constitutes the p-type collector region of the bipolar transistor Tr2, the buried n+-type semiconductor region 52 as its n-type base region, and a p−-type semiconductor substrate 50 as its p-type collector region. Owing to the diode element D, the potential of the n-type base region (52) of the parasitic p-n-p bipolar transistor of vertical structure is normally held higher as compared with the potential of the p-type emitter region thereof (the p-type collector region 55 of the bipolar transistor Tr2), so that the operation of the parasitic thyristor which is constituted by the bipolar transistor Tr2 and the parasitic p-n-p bipolar transistor of vertical structure can be avoided to prevent the latch-up phenomenon.

Besides, as schematically shown in FIG. 10, the p-n-p bipolar transistor of vertical structure Tr2 of the output stage circuit has a plurality of divided contact holes (emitter openings) 59 for connecting the p-type emitter region (p-type semiconductor region 56) and the first-layer wiring line 62. That is, within a certain predetermined area, the number of the contact holes (emitter openings) 59 is increased, and the spaced areas between the adjacent contact holes 59 are enlarged, whereby the bipolar transistor Tr2 contracts the contact area between the p-type emitter region (p-type semiconductor region 56) and the first-layer wiring line 62 in correspondence with the spaced areas. The contraction of the contact area can decrease the amount of electrons which flow from the n−-type epitaxial layer 51 constituting the n-type base region into the first-layer wiring line 62, namely, the magnitude of the base current of the bipolar transistor Tr2, and can contrariwise increase the amount of holes which are injected from the p-type emitter region into the n-type base region, namely, the magnitude of the forward emitter current of the bipolar transistor Tr2. Accordingly, the current gain of the bipolar transistor Tr2 can be heightened.

In this manner, the plurality of divided contact holes (emitter openings) 59 are provided for connecting the first-layer wiring line 62 and the p-type emitter region (p-type semiconductor region 56) of the p-n-p bipolar transistor of vertical structure Tr2 of the output stage circuit. This construction makes it possible to decrease the magnitude of the base current of the bipolar transistor Tr2 and to increase the magnitude of the forward emitter current, so that the current gain can be heightened.

Moreover, the p-type emitter region (p-type semiconductor region 56) of the p-n-p bipolar transistor of vertical structure Tr2 of the output stage circuit as stated above is divided into a plurality of portions. The magnitude of current which flows through the p-type emitter region is larger at the peripheral parts of this region than at the central part thereof. More specifically, the bipolar transistor Tr2 of the output stage circuit is made larger in the planar size of the p-type emitter region than the bipolar transistor Tr2 of any internal circuit block, so that the magnitudes of currents to flow per unit area are equalized in both the output stage circuit and the internal circuit block (the perimetric lengths of emitters are equalized).

As illustrated in FIGS. 5 thru 7, the semiconductor integrated circuit device 10 stated before has the isolating portion BG arranged in the interspace between the luminance signal processing unit 11 and the color signal processing unit 12. The isolating portion BG signifies means for isolating the luminance signal processing unit 11 with the color signal processing unit 12. The sectional structure and planar structure of the isolating portion BG are respectively shown in FIG. 8 (B) and in FIG. 11 (a sectional view of essential portions).

As shown in FIGS. 5 thru 7 and FIG. 11, the isolating portion BG extends laterally at the boundary part between the luminance signal processing unit 11 and color signal processing unit 12 of the semiconductor integrated circuit device 10. That is, the isolating portion BG extends laterally from the pin (BP) No. 15 toward the pin (BP) No. 42 of the semiconductor integrated circuit device 10 so as to intersect one set of opposing sides of the chip (semiconductor integrated circuit device) 10.

Figure 8B:
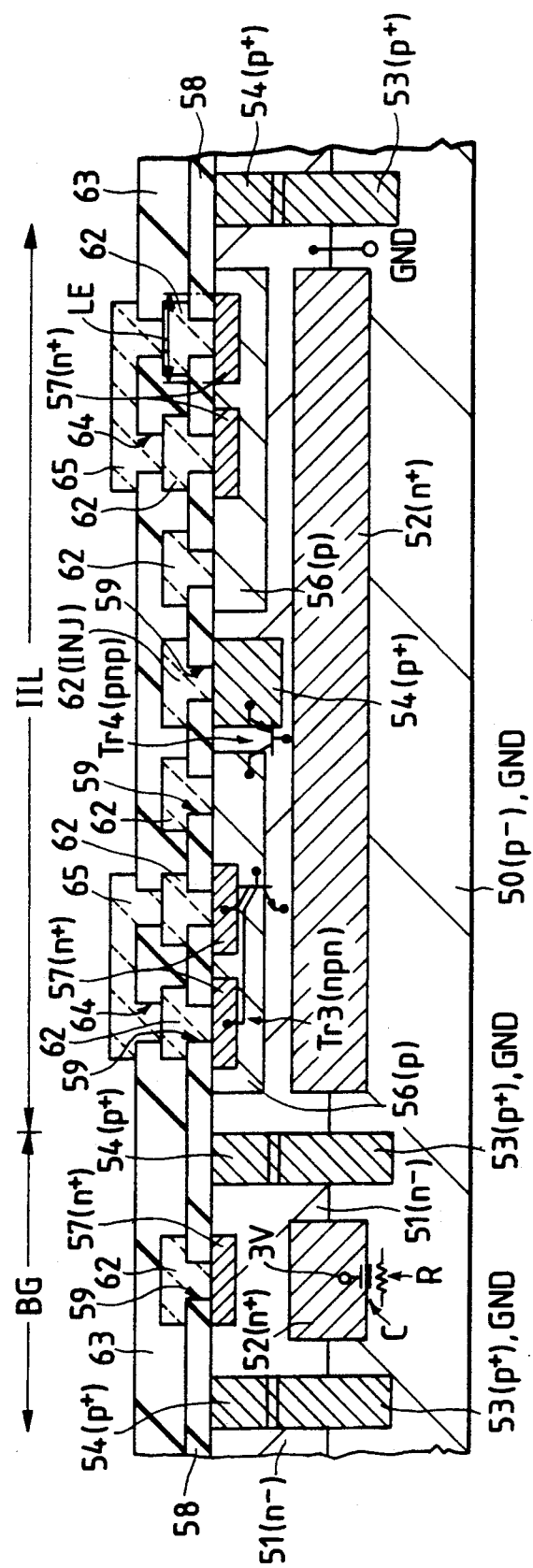

As shown in FIG. 8(B) and FIG. 11, the isolating portion BG includes an element isolation region, and an active island region which is provided within a region surrounded with the element isolation region. The active island region includes the $n^-$-type epitaxial layer 51, a buried $n^+$-type semiconductor region 52 and an $n^+$-type semiconductor region 57.

The element isolation region of the isolating portion BG includes the $p^-$-type semiconductor substrate 50 and $p^+$-type semiconductor regions 53, 54. The $p^+$-type semiconductor regions 53 and 54 of the element isolation region of the isolating portion BG are provided on each of the side walls of the $n^-$-type epitaxial layer 51 as well as the buried $n^+$-type semiconductor region 52 of the isolating portion BG, and the sets of the $p^+$-type semiconductor regions 53 and 54 provided on the respective side walls are extended laterally at the boundary part substantially in parallel with each other. Although no illustration is made, the $p^-$-type semiconductor substrate 50 and the $p^+$-type semiconductor regions 53, 54 constituting the element isolation region are connected to the external terminal (BP: pin No. 13) 65 to which the reference supply voltage GND is applied through the reference supply voltage wiring line GND formed of the first-layer wiring line 62.

The $n^+$-type semiconductor region 57 of the isolating portion BG is fed with the D.C. reference supply voltage (3 [V]) through the first-layer wiring line 62, with the result that all of the $n^+$-type semiconductor region 57, $n^-$-type epitaxial layer 51 and buried $n^+$-type semiconductor region 52 are fed with the D.C. reference supply voltage. This D.C. reference supply voltage is fed from the external terminal (BP: pin No. 41) 65. As stated before, it is the bias which is stable (grounded) A.C.-wise.

The isolating portion BG operates as a low-pass filter (LPF) which mainly includes a parasitic capacitor C formed at the p-n junction between the buried $n^+$-type semiconductor region 52 and the $p^-$-type semiconductor substrate 50, and a parasitic resistor R formed of the $p^-$-type semiconductor substrate 50. The low-pass filter is so constructed that the buried $n^+$-type semiconductor region 52 having a high impurity density is provided at a part contacting with the $p^-$-type semiconductor substrate 50 of the element isolation region, whereby the capacitance of the parasitic capacitor C is increased so as to eliminate the phenomenon of crosstalk oscillation in a higher frequency band. In addition, the low-pass filter is so constructed that the $n^-$-type epitaxial layer 51 or buried $n^+$-type semiconductor region 52 of the isolating portion BG is provided, whereby the resistance of the parasitic resistor R in the $p^-$-type semiconductor substrate 50 is increased so as to eliminate the crosstalk oscillation phenomenon in the higher frequency band.

A high frequency having arisen in, for example, the luminance signal processing unit 11 leaks as noise into the color signal processing unit 12 through the substrate 50, to degrade the S/N ratio of the color signal of the unit 12 by way of example. In order to prevent such degradation, according to the present invention, the region (isolating portion) having the high resistance and the high capacitance is deliberately interposed between the luminance signal processing unit 11 and the color signal processing unit 12 as described above, whereby the high frequency is trapped. Accordingly, the isolating portion BG might be termed a "high-frequency trap region" rather than the low-pass filter.

In this manner, in a semiconductor integrated circuit device 10, a luminance signal processing unit 11 and a color signal processing unit 12 for a color VTR 1 are respectively constructed in the regions of the principal surface of an identical $p^-$-type semiconductor substrate 50 differing from each other, and an isolating portion BG which is fed with a bias stable A.C.-wise (a D.C. reference supply voltage: 3 [V]) is constructed in the interspace of the principal surface of the $p^-$-type semiconductor substrate 50 between the luminance signal processing unit 11 and the signal processing unit 12. Owing to this construction, as compared with a case where the luminance signal processing unit 11 and the color signal processing unit 12 are respectively constructed in the principal surfaces of individual semiconductor substrates, the implementation in the shape of one chip can contract especially the area of shared portions to the utmost, so that the density of integration of the semiconductor integrated circuit device 10 can be heightened. Simultaneously, the crosstalk oscillation phenomenon between the luminance signal of the luminance signal processing unit 11 and the color signal of the color signal processing unit 12 can be relieved by the isolating portion BG, so that noise which develops in both the luminance signal and the color signal can be reduced.

Moreover, since the crosstalk oscillation phenomenon between the luminance signal of the luminance signal processing unit 11 and the color signal of the color signal processing unit 12 can be relieved, the spacing between the luminance signal processing unit 11 and the color signal processing unit 12 can be shortened to heighten the density of integration of the semiconductor integrated circuit device 10 still more.

Further, each of the luminance signal processing unit 11 and the color signal processing unit 12 comprises circuit blocks including as their main constituents bipolar transistors Tr which are formed in active island regions surrounded with an element isolation region, and the isolating portion BG comprises an active island region (an $n^-$-type epitaxial layer 51, a buried $n^+$-type semiconductor region 52 and an $n^+$-type semiconductor region 57) which is surrounded with the element isolation region and which is formed by the same manufacturing steps as those of the bipolar transistors Tr, the D.C. reference supply voltage being fed to the active island region. Owing to this construction, the band gap BG operates as a low-pass filter (LPF) between the luminance signal processing unit 11 and the color signal processing unit 12, and the resistance of a parasitic resistor R which is formed between the luminance signal processing unit 11 and the color signal processing unit 12 can be increased in correspondence with the active island region of the isolating portion BG, so that thee crosstalk oscillation phenomenon of higher frequency band between the luminance signal and the color signal can be relieved still more by the low-pass filter.

Moreover, the active island region of the isolating portion BG has a higher impurity density at a part (the buried $n^+$-type semiconductor region 52) lying in contact with the element isolation region, than at any other part. Owing to this construction, the isolating portion BG can increase the capacitance of a parasitic capacitor C which is formed between the active island region and the element isolation region, so that the crosstalk oscillation phenomenon of higher frequency band between the luminance signal and the color signal can be relieved still more by the low-pass filter.

As illustrated in FIGS. 5 thru 7 and FIG. 11, the D.C. reference supply voltage which is fed to the isolating portion BG is generated by the stabilized power source circuit 1001. This stabilized power source circuit 1001 is arranged as a circuit which is shared by the luminance signal processing unit 11 and the color signal processing unit 12, and it is interposed between both these units 11 and 12. Moreover, it is allocated near the pin No. 41 among the external terminals (BP) 65.

As shown in FIG. 11, the D.C. reference supply voltage generated by the stabilized power source circuit 1001 is delivered as an output by an n-p-n bipolar transistor of vertical structure Tr1 included in the output stage circuit of this power source circuit. The delivered D.C. reference supply voltage is applied as an input to the external terminal (BP: pin No. 41) 65 (as well as 62) through the first-layer wiring line 62. The external terminal 65 is externally provided with a noise eliminating capacitor (electrolytic capacitor), by which the D.C. reference supply voltage has noise eliminated therefrom. The noiseless D.C. reference supply voltage is fed to the luminance signal processing unit 11 and the color signal processing unit 12 independently of each other with the external terminal 65 intervening again. More specifically, the D.C. reference supply voltage is fed from the external terminal 65 to the luminance signal processing unit 11 through the second-layer wiring line 65 as well as the first-layer wiring line 62. On the other hand, it is fed from the external terminal 65 to the color signal processing unit 12 through another first-layer wiring line 62.

In this manner, in a semiconductor integrated circuit device 10, a luminance signal processing unit 11 and a color signal processing unit 12 for a color VTR 1 are respectively constructed in the regions of the principal surface of an identical $p^-$-type semiconductor substrate 50 differing from each other, and a stabilized power source circuit (shared circuit) 1001 which is common to both the luminance signal processing unit 11 and the signal processing unit 12 is arranged at the boundary part between these units 11 and 12. Owing to this construction, as compared with a case where the luminance signal processing unit 11 and the color signal processing unit 12 are respectively constructed in the principal surfaces of individual semiconductor substrates, the implementation in the shape of one chip can contract especially the area of shared portions to the utmost, so that the density of integration of the semiconductor integrated circuit device 10 can be heightened. Simultaneously, the connection distances between the luminance signal processing unit 11 and the stabilized power source circuit 1001 and those between the color signal processing unit 12 and the stabilized power source circuit 1001 can be respectively made the shortest, and the lengths to-be-led-about of wiring lines for connecting the luminance signal processing unit 11 and the stabilized power source circuit 1001 and wiring lines for connecting the color signal processing unit 12 and the stabilized power source circuit 1001 can be respectively decreased, so that the density of integration of the semiconductor integrated circuit device 10 can be heightened still more in correspondence with the decrease of the lengths to-be-led-about of the wiring lines.

Besides, the laying lengths of the wiring lines for connecting the luminance signal processing unit 11 and the stabilized power source circuit 1001 and the wiring lines for connecting the color signal processing unit 12 and the stabilized power source circuit 1001 can be respectively shortened to lower the probability at which the phenomenon of crosstalk oscillation occurs between the individual wiring lines, so that noise to develop in the luminance signal and the color signal can be reduced.

Further, the wiring lines for connecting the luminance signal processing unit 11 with the stabilized power source circuit 1001 and those for connecting the color signal processing unit 12 with the stabilized power source circuit 1001 are laid independently of each other. Owing to this construction, the wiring lines for connecting the luminance signal processing unit 11 with the stabilized power source circuit 1001 and those for connecting the color signal processing unit 12 with the stabilized power source circuit 1001 do not have common impedances therebetween, so that the crosstalk oscillation phenomenon between the wiring lines can be relieved to reduce noise which develops in both the luminance signal and the color signal.

Besides, an external terminal (pin No. 41) BP which is fed with the D.C. reference supply voltage generated by the stabilized power source circuit 1001 is interposed between an external terminal (especially, pin No. 42) BP for the signal of the luminance signal processing unit 11 and an external terminal (especially, pin No. 40) BP for the signal of the color signal processing unit 12. Owing to this construction, the crosstalk oscillation phenomenon between terminals, which arises between the signal external terminal BP of the luminance signal processing unit 11 and the signal external terminal BP of the color signal processing unit 11, can be relieved by the external terminal (pin No. 41) BP which is fed with the D.C. reference supply voltage, so that noise to develop in both the luminance signal and the color signal can be reduced.

A logic section which includes IIL circuits is arranged in the color signal processing unit 12 of the semiconductor integrated circuit device 10. The logic section includes the burst gate pulse generator circuit 1215, the frequency detecting counter circuit 1216 and the AFC counter circuit 1217 which are shown in FIGS. 1 and 5.

The practicable sectional structure of the IIL circuit is shown in FIG. 8(B). The IIL circuit is so constructed that, within a region surrounded with the element isolation region, the p-n-p bipolar transistor of lateral structure Tr4 and the n-p-n bipolar transistor of vertical structure Tr3 are provided between an injection wiring line (INJ) and a reference supply voltage wiring line (GND).

The bipolar transistor Tr4 of the IIL circuit is constructed by arraying a p-type collector region, an n-type base region and a p-type emitter region in the lateral direction.

The p-type emitter region includes a p$^+$-type semiconductor region 54. This p$^+$-type semiconductor region 54 is connected to the first-layer wiring line 62 being the injection wiring line.

The n-type base region includes the n$^-$-type epitaxial layer 51 and a buried n$^+$-type semiconductor region 52. Likewise to the n-type base region of the p-n-p bipolar transistor of vertical structure Tr2, the n$^-$-type epitaxial layer 51 of the n-type base region of the bipolar transistor Tr4 has its impurity density set somewhat higher, thereby to heighten the current gain of this bipolar transistor.

The p-type collector region includes a p-type semiconductor region 56.

The bipolar transistor Tr3 of the IIL circuit is constructed by arraying an n-type collector region, a p-type base region and an n-type emitter region in the vertical direction.

The n-type collector region includes an n$^+$-type semiconductor region 57. The n$^+$-type semiconductor region 57 is divided into a plurality of portions, and the bipolar transistor Tr3 has a multicollector structure. The plurality of divisional portions of the n$^+$-type semiconductor region 57 are connected with the input of a succeeding stage through electtrodes 62 formed of the first-layer wiring lines 62, as well as the second-layer wiring line 65.

The above n-type collector region is automatically laid out by the CAD as a cell pattern which includes contact holes (collector openings) 59 and the electrodes (first-layer wiring lines) 62. The automatic layout based on the CAD can shorten the period of time for developing the semiconductor integrated circuit device 10.

The cell pattern is governed by the planar size of the contact holes 59. On the basis of design rules centering on the contact holes 59, the planar sizes of the electrodes 62 and the n-type collector region (57) provided in stacked fashion are defined, and the planar size of the cell pattern $L_E$ shown in FIG. 8(B) is defined. The automatic layout based on the CAD is effected by simply placing the cell pattern of the upper layer on the cell pattern $L_E$. The planar size of the cell pattern of the upper layer is determined by the planar size of contact holes 64 governing this pattern, the planar size of the electrodes 62 for ensuring the registration thereof with the cell pattern $L_E$ of the lower layer, and the planar size of the second-layer wiring line 65. When the cell pattern of the upper layer is to be placed on the cell pattern $L_E$ of the lower layer, the size (information) of the electrodes 62 of the former has its logical sum (OR) taken with the pattern size of the electrodes 62 of the latter, and either larger one of the patterns is adopted. Therefore, the pattern size of the electrodes 62 of the cell pattern of the upper layer is set to be smaller as compared with that of the electrodes 62 of the cell pattern $L_E$ of the lower layer. By way of example, the electrodes 62 of the cell pattern $L_E$ of the lower layer are formed having a planar size of $10 \times 10$ [$\mu m^2$], while those of the cell pattern of the upper layer are formed having a planar size of $9 \times 9$ [$\mu m^2$]. That is, whenever the cell pattern of the upper layer is placed on the cell pattern $L_E$ of the lower layer, the pattern size is governed by the latter. By performing such automatic layout based on the CAD, the pattern interval between the cell patterns $L_E$ of the lower layer can be contracted to the minimum to enhance the regularity of the layout of this cell pattern, so that the density of integration of the semiconductor integrated circuit device 10 can be heightened.

The p-type base region includes a p-type semiconductor region 56. This p-type base region is connected with the p-type collector region of the bipolar transistor Tr4.

The n-type emitter region includes the n$^-$-type epitaxial layer 51 and the buried n$^+$-type semiconductor region 52. This n-type emitter region is connected with the n-type base region of the bipolar transistor Tr4.

Figure 12:
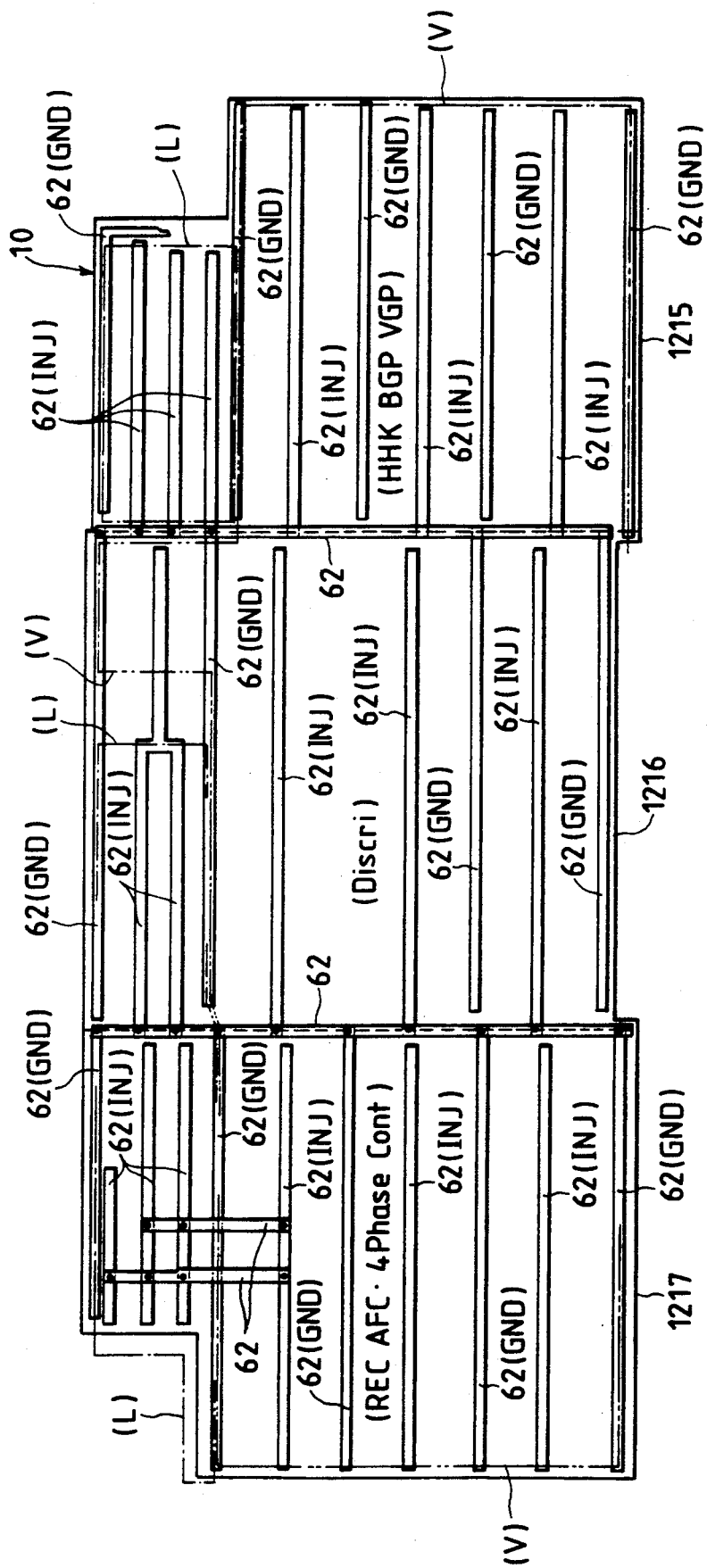
FIG. 12 is a layout plan view of the essential portions of a logic section which is included in the semiconductor integrated circuit device.
Figure 13:
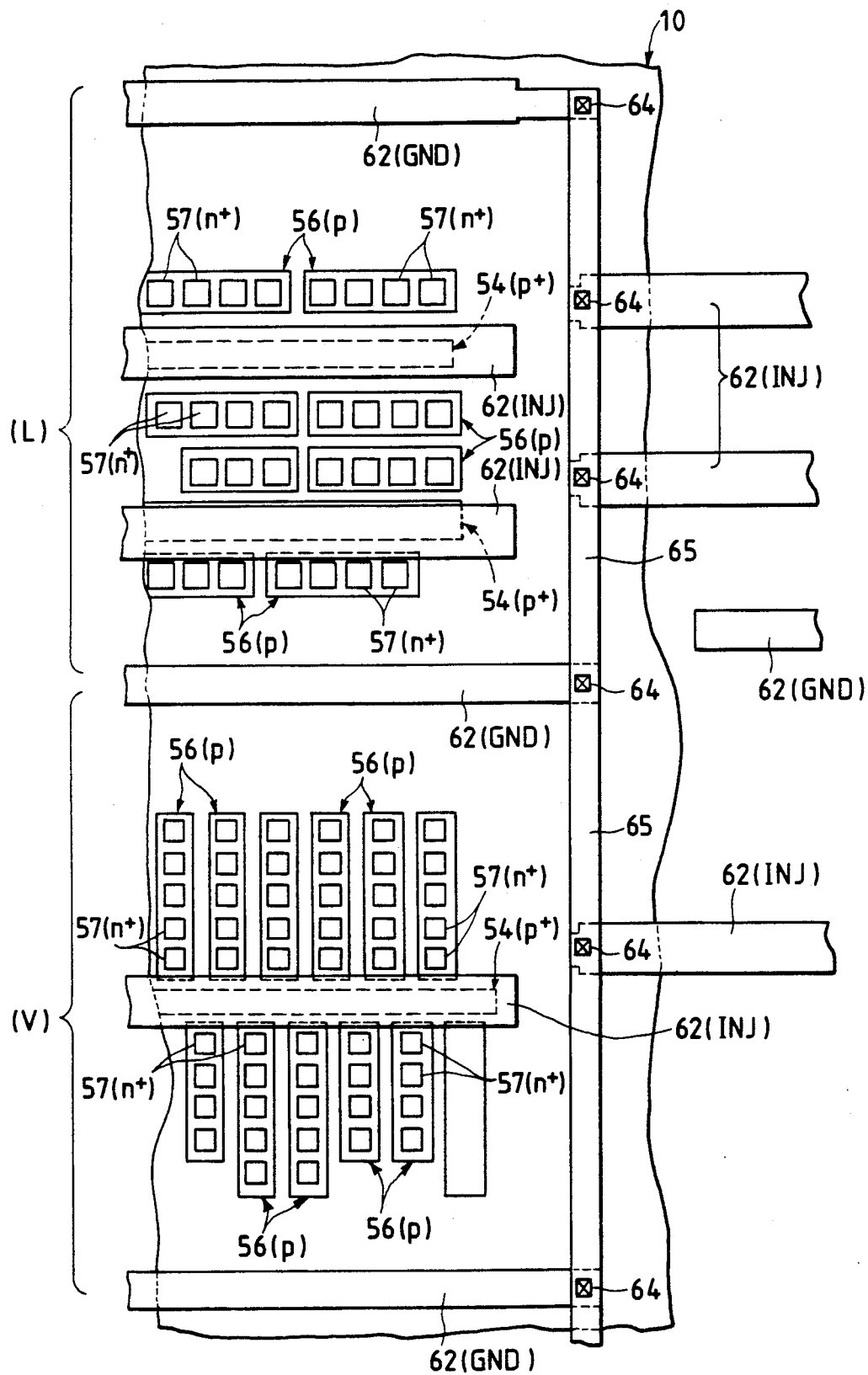
FIG. 13 is an enlarged layout plan view of the essential portions of the logic section.

As illustrated in FIG. 12 (a layout plan of essential portions) and FIG. 13 (an enlarged layout plan of essential portions), the IIL circuits thus constructed are arranged in a lateral (L) configuration and a vertical (V) configuration in each of the burst gain pulse generator circuit 1215, the frequency detecting counter circuit 1216 and the AFC counter circuit 1217. As shown in FIG. 13, the IIL circuit of the lateral configuration (L) is such that the plurality of divisional portions of the n-type collector region 57 of the bipolar transistor Tr3 are arrayed in the extending direction of the injection wiring line (INJ) 62 as well as the reference supply voltage wiring line (GND) 62. The IIL circuit of the lateral configuration (L) can enhance the operating frequency as compared with the IIL circuit of the vertical configuration (V).

On the other hand, the IIL circuit of the vertical configuration (V) is such that the plurality of divisional portions of the n-type collector region 57 of the bipolar transistor Tr3 are arrayed in a direction orthogonal to the extending direction of the injection wiring line (INJ) 62 as well as the reference supply voltage wiring line (GND) 62. The IIL circuit of the vertical configuration (V) can enhance the density of integration as compared with the IIL circuit of the lateral configuration (L).

The IIL circuits of the burst gate pulse generator circuit 1215, frequency detecting counter circuit 1216 and AFC counter circuit 1217 are constructed with a stacked structure in order to lower the power consumption thereof. By way of example, the stacked structure is a structure in which a plurality of stages of IIL circuits are arranged between the circuit operation supply voltage $V_{CC}$ (5 [V]) and the reference supply voltage GND (0 [V]). Here, volateges are applied in succession in such a manner that the circuit operation supply voltage $V_{CC}$ is applied to the injection wiring line of the IIL circuit of the first stage, and that the reference supply voltage of the IIL circuit of the first stage is applied to the injection wiring line of the IIL circuit of the next stage. The reference supply voltage of the IIL circuit of the final stage is set at the reference supply voltage GND or a potential close thereto.

The IIL circuits of the semiconductor integrated circuit device 10 in this embodiment is constructed with the stacked structure of three stages in which the IIL circuit of the first stage (upper stage) is the AFC counter circuit 1217, that of the middle stage is the frequency detecting counter circuit 1216, and that of the final stage (lowe stage) is the burst gate pulse generator circuit 1215 (the number of stages shall not be restrictive). As shown in FIG. 12, the plurality of injection wiring lines (INJ) 62 extending in the lateral direction an the plurality of reference supply volatage wiring lines (GND) 62 extending in the same lateral direction are laid in each of the first-stage IIL circuit, middle-stage IIL circuit and final-stage IIL circuit. As clearly seen from FIG. 13, the plurality of injection wiring lines 62 of the IIL circuit of each stage are short-circuited by the second-layer wiring line 65 extending in the vertical direction.

The first-stage IIL circuit, middle-stage IIL circuit and final-stage IIL circuit are respectively arranged as the plurality of stages stacked in the same lateral direction as the direction in which the injection wiring lines 62 and the reference supply volatage wiring lines 62 extend. That is, the IIL circuits of th respective stages are arranged from the left side toward the right side of the semiconductor integrated circuit device 10 as shown in FIG. 5 and 12.

As illustrated in FIGS. 12 and 13, the reference supply voltage wiring lines 62 of the IIL circuit of the first stage are connected to the left ends of the injection wiring lines 62 of the IIL circuit of the next stage through the second-layer wiring line 65 extending vertically, at the right ends of these reference supply volatage wiring lines of the first-stage IIL circuit, in other words, in the element isolation region which is the boundary part between the IIL circuit of the first stage and that of the next stage. Likewise, the reference supply voltage wiring lines 62 of the IIL circuit of the middle stage are connected to the left ends of the injection wiring lines 62 of the IIL circuit of the final stage through the second-layer wiring line 65 extending vertically, at the right ends of these reference supply voltage wiring lines of the middle-stage IIL circuit, in other words, in the element isolation region which is the boundary part between the IIL circuit of the middle stage and that of the final stage. The connection positions of the second-layer wiring lines 65 with the reference supply voltage wiring lines 62 and the injection wiring lines 62 are basically prevented from agreeing.

In this manner, in a semiconductor integrated circuit device 10 wherein a plurality of stages of IIL circuits, in each of which a plurality of injection wiring lines (INJ) 62 and a plurality of reference supply voltage wiring lines (GND) 62 are respectively laid substantially in parallel, are stacked; the plurality of stages of IIL circuits are arranged in the extending direction of the injection wiring lines 62 and the reference supply voltage wiring lines 62, and the plurality of reference supply voltage wiring lines 62 of the IIL circuit of the first stage (or middle stage) among the plurality of stages of IIL circuits are connected with the plurality of injection wiring lines 62 of the IIL circuit of the middle stage (or final stage). Owing to this construction, by connecting either of the plurality of reference supply voltage wiring lines 62 of the IIL circuit of the first stage (or middle stage) and the plurality of injection wiring lines 62 the IIL circuit of the middle stage (or final stage), the other of them can be connected. It is therefore possible to decrease the area of wiring and heighten the density of integration of the semiconductor integrated circuit device 10, in correspondence with a second-layer wiring line 65 for connecting (short-circuiting) the plurality of injection wiring lines 62 of the IIL circuit of the middle stage (or final stage) or the plurality of reference supply voltage wiring lines 62 of the IIL circuit of the first stage (or middle stage).

In addition, the wiring length of the second-layer wiring line 65 for short-circuiting can be shortened to the extent of connecting the plurality of reference supply voltage wiring lines 62 of the IIL circuit of the first stage (or middle stage) or the plurality of injection wiring lines 62 of the IIL circuit of the middle stage (or final stage), and the resistance of the short-circuiting wiring line can be lowered. Therefore, the potential rise of the reference supply voltage wiring lines 62 and the potential fall of the injection wiring lines 62 are canceled to render current balances uniform in all of the first-stage IIL circuit, middle-stage IIL circuit and final-stage IIL circuit. As a result, the operating margins of the IIL circuits of the stacked structure can be widened.

Besides, the plurality of reference supply voltage wiring lines 62 of the IIL circuit of the first stage (or middle stage) and the plurality of injection wiring lines 62 of the IIL circuit of the middle stage (or final stage) are connected in the element isolation region which lies at the boundary part between the IIL circuit of the first stage (middle stage) and that of the middle stage (or final stage). Owing to this construction, the plurality of reference supply voltage wiring lines 62 or the plurality of injection wiring lines 62 can be connected by utilizing the occupation area of the element isolation region. Therefore, the density of integration of the semiconductor integrated circuit device 10 can be heightened in correspondence with the wiring area for the connection.

Moreover, since the logic section (IIL circuits) uses the bias supply voltage stable A.C.-wise, it is arranged between the circuit blocks for processing the main signal of the color signal of the color signal processing unit 12 and the circuit blocks of the pulse generation loop for processing the main signal of the color signal. That is, the logic section is allocated substantially centrally of the color signal processing unit 12. The circuit blocks for processing the main signal of the color signal are the auto balance circuit 1204, REC low-pass filter circuit 1201, killer amplifier circuit 1202, burst emphasis circuit 1203, $T_o$ ACC detector amplifier switch circuit 1212, $T_o$ APC amplifier switch circuit 1213 and ACC detector circuit 1214. The circuit blocks of the pulse generation loop for processing the main signal of the color signal are the crystal oscillator 1223, REC AFC circuit 1219 and discriminator circuit 1218.

In this manner, in a semiconductor integrated circuit device 10, a logic section (IIL circuits) is allocated between circuit blocks for processing the main signal of the color signal of a color signal processing unit 12 and the circuit blocks of a pulse generation loop for processing the main signal of the color signal. Owing to this construction, pulsebased signals which are produced from the circuit blocks of the pulse generation loop for processing the main signal of the color signal are shielded by the logic section, so that the phenomenon of crosstalk oscillation into the circuit blocks for processing the main signal of the color signal or into the luminance signal processing unit 11 of the device 10 can be relieved.

Further, the logic section (IIL circuits) may well be inserted as the band gap BG between the luminance signal processing unit 11 and the color signal processing unit 12.

Figure 14:
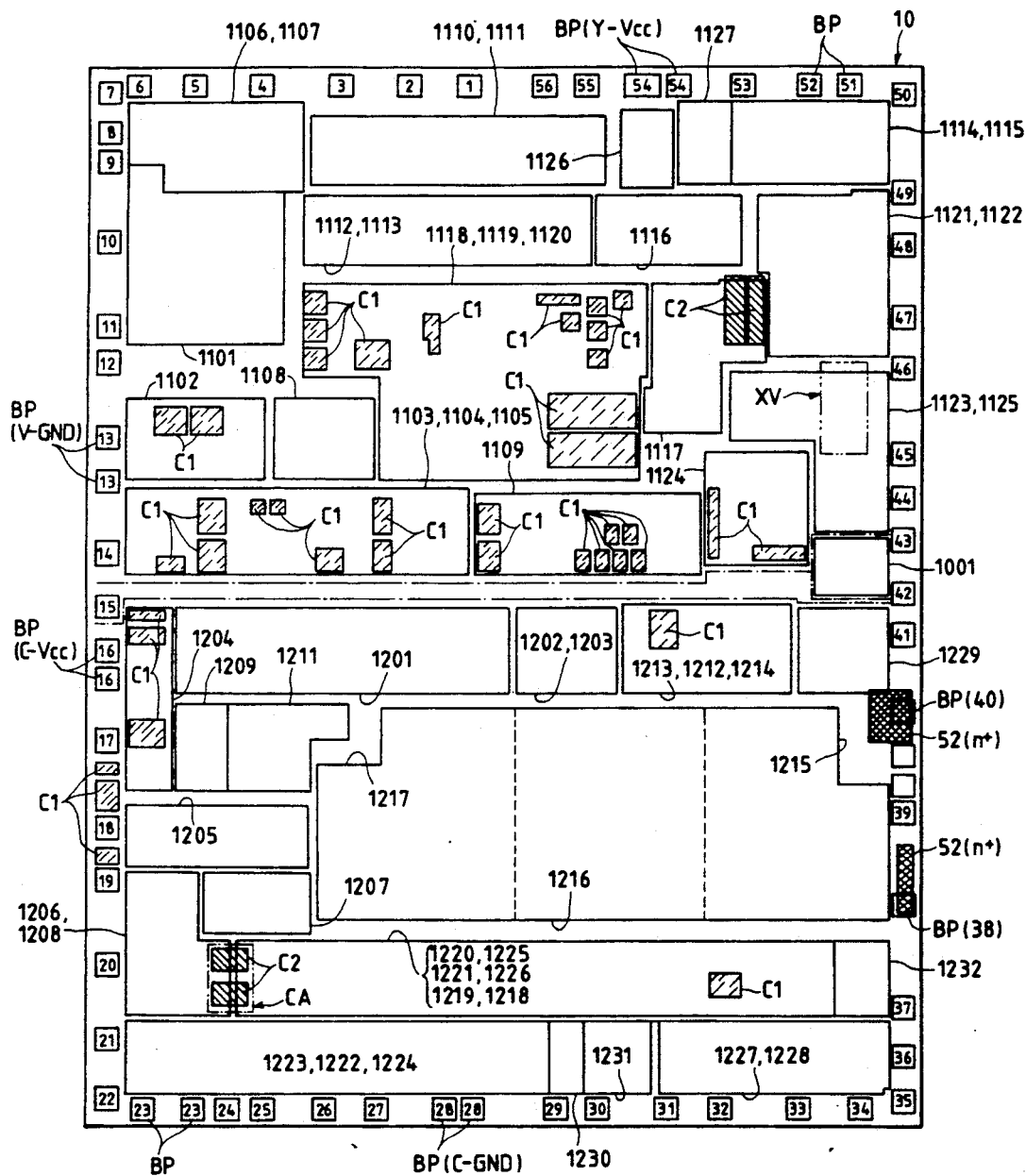
FIG. 14 is a chip layout plan of the semiconductor integrated circuit device.

As illustrated in FIG. 14 (a chip layout plan), the semiconductor integrated circuit device 10 is such that a plurality of capacitors C1 or/and C2 are arranged in each of the circuit blocks. In addition, a plurality of resistors R1 or/and R2 are arranged in that region within FIG. 14 which is surrounded with a two-dot chain line and to which symbol XV is assigned, namely, in each of the video AGC circuit 1123, AGC detector circuit 1125, etc.

Figure 8C:
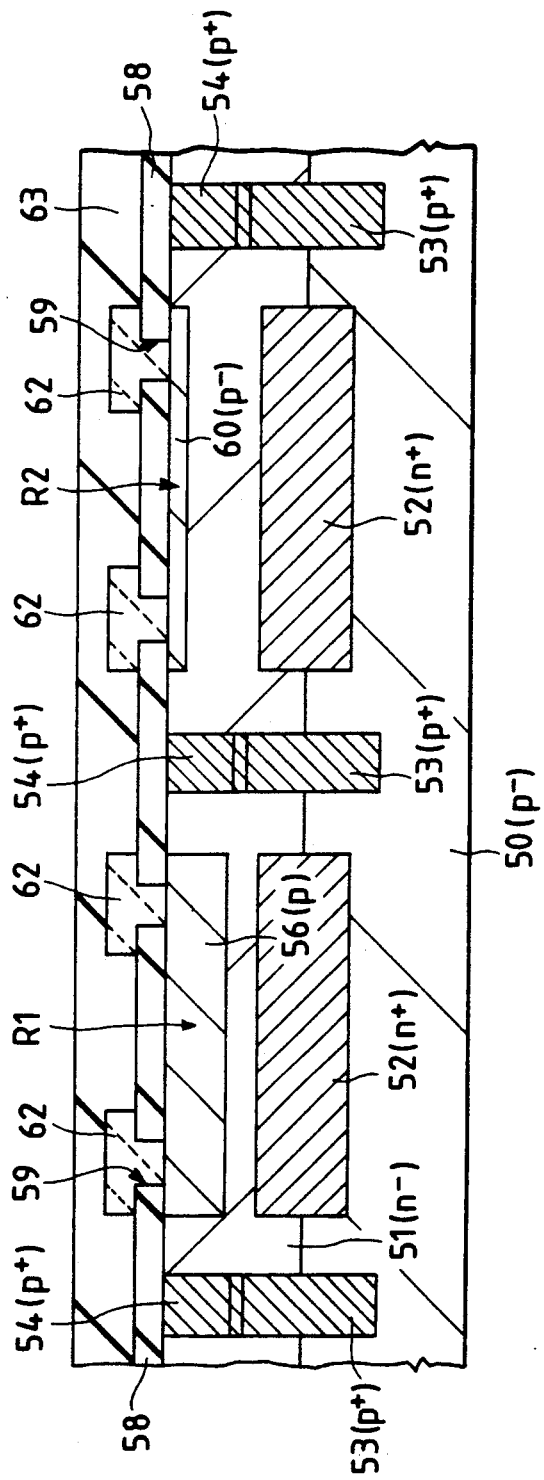

As shown in FIG. 8(C), the resistor R1 includes a p-type semiconductor region 56 which is formed within a region surrounded with the element isolation region. The one-end side and the other-end side of the p-type semiconductor region 56 constituting the resistor R1 are respectively connected to first-layer wiring lines 62 (or second-layer wiring lines 65). The resitor R1 is formed having a sheet resistance on the order of, for example, 200–400 [$\Omega/\square$].

As shown in FIG. 8(C), the resistor R2 includes a $p^-$-type semiconductor region 60 which is formed within a region surrounded with the element isolation region. In the same manner as in the resistor R1, the one-end side and the other-end side of the $p^-$-type semiconductor region 60 constituting the resistor R2 are respectively connected to first-layer wiring lines 62 (or second-layer wiring lines 65). By way of example, the $p^-$-type semiconductor region 60 is formed at an impurity density on the order of $10^{17}$–$10^{18}$ [atoms/cm$^3$] and a high sheet resistance on the order of 1–5 [$k\Omega/\square$].

Figure 15:
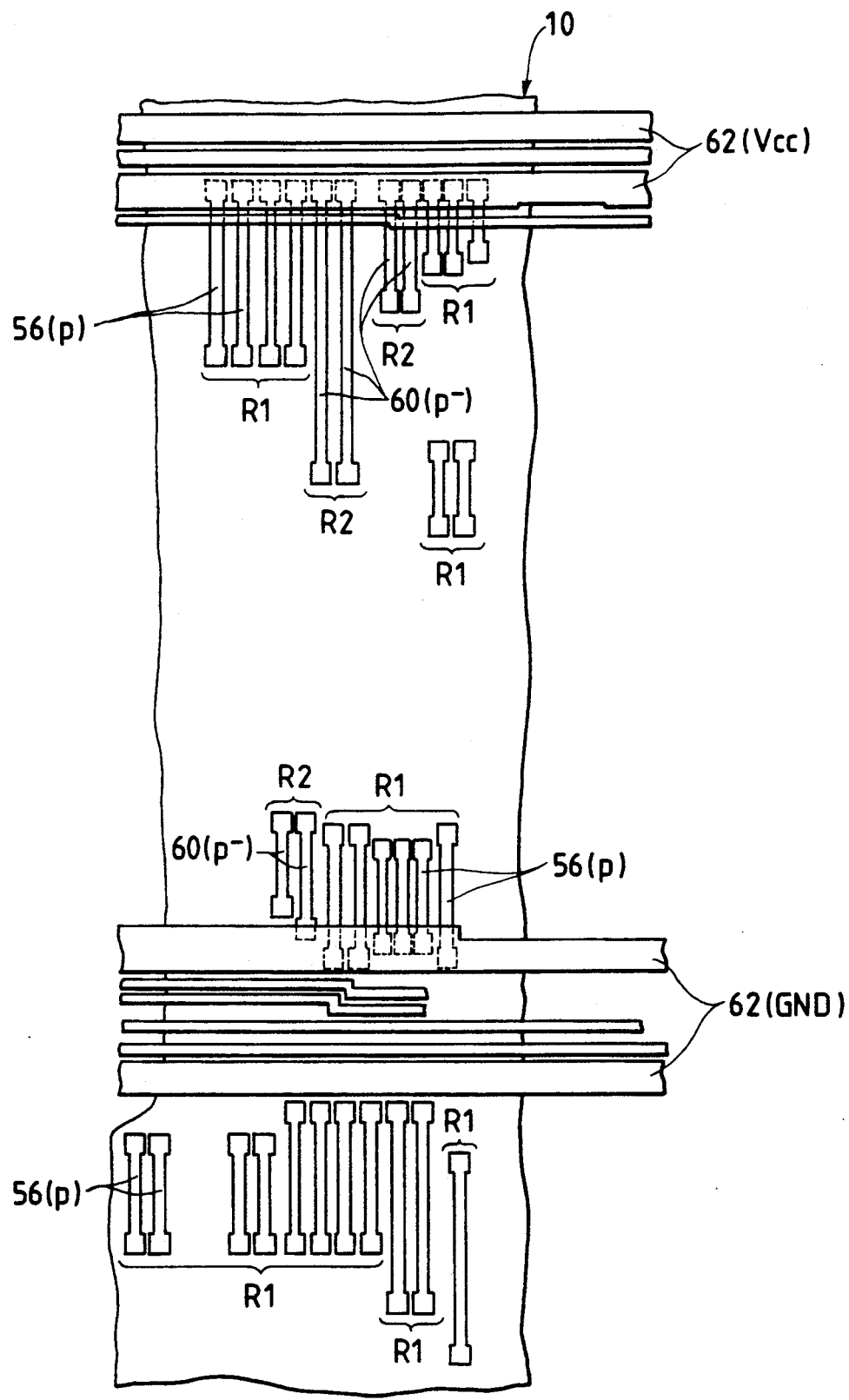
FIG. 15 is an enlarged plan view of the essential portions of the semiconductor integrated circuit device.

As illustrated in FIG. 15 (an enlarged plan view of essential portions), both the resistors R1 and R2 are arranged in such a manner that the direction (from the circuit operation supply voltage $V_{CC}$ toward the reference supply voltage GND) in which currents flow within each circuit block agrees with the direction of the lengths of the resistors. That is, substantially all the resistors R1 and R2 arranged in the semiconductor integrated circuit device 10 are in the same direction agreeing with the current direction.

In this manner, the extending directions of the resistors R1 and R2 which ar formed in the semiconductor integrated circuit device 10 are made unidirectional. Owing to this construction, the magnitudes of fluctuations in the piezoelectric effect attributed to stresses which develop after resin encapsulation can be made uniform to equalize the magnitudes of fluctuations in the resistances of the resistors R1 and R2, so that the operating margins of the circuits of the device 10 can be widened.

Figure 8D:
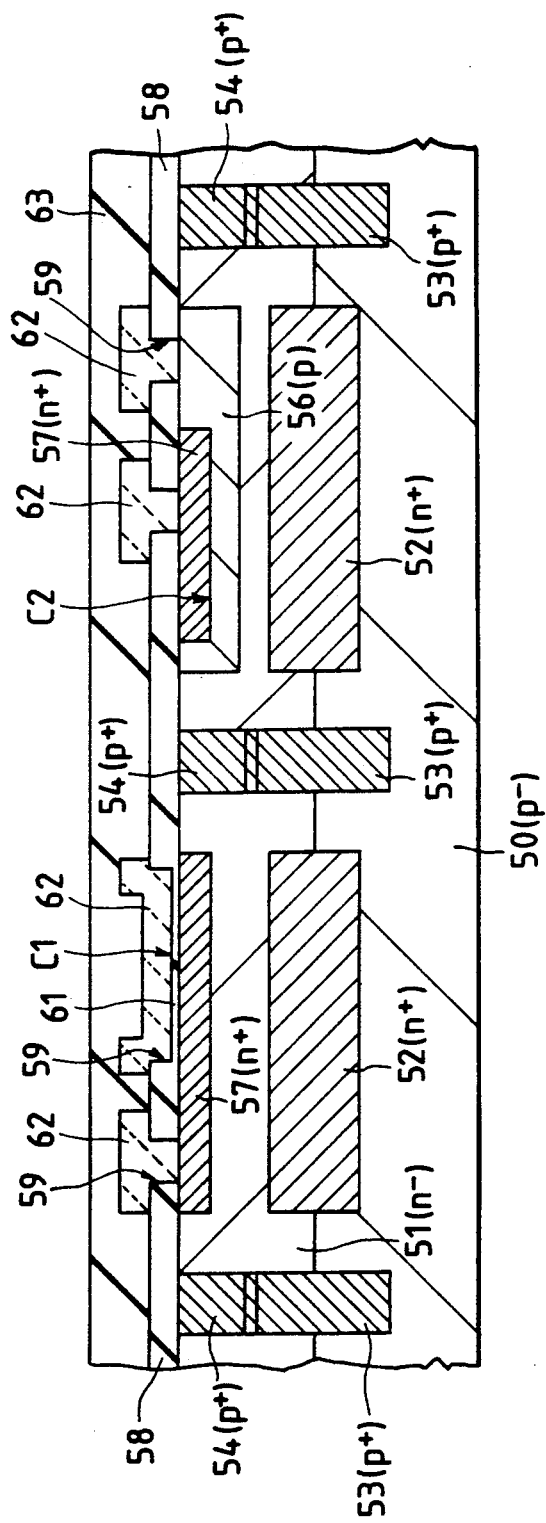

As illustrated in FIG. 8(D), the capacitor C1 is arranged within a region surrounded with the element isolation region. It is constructed as a MOS capacitor in which an $n^+$-type semiconductor region 57, a dielectric film (for example, silicon oxide film) 61 and an electrode 62 are stacked in succession. The $n^+$-type semiconductor region 57 of this capacitor C1 is connected to the first-layer wiring line 62.

Also, as illustrated in FIG. 8(D), the capacitor element isolation region. It is constructed as a p-n junction capacitor which includes a p-type semiconductor region 56 and an $n^+$-type semiconductor region 57 formed in the principal surface of the region 56. The first-layer wiring lines 62 are respectively connected to the p-type semiconductor region 56 and $n^+$-type semiconductor region 57 of this capacitor C2.

Among the capacitors C2, those for use in the 535$f_H$ VCO circuit 1208 of the color signal processing unit 12 (a part enclosed with a dot-and-dash line CA in FIG. 14) can have capacitances controlled by a trimming treatment. The trimming treatment is such that the first-layer wiring line 62 or second-layer wiring line 65 which connect the capacitors C2 is cut with, for example, a laser beam.

Besides, as shown in FIG. 14, buried $n^+$-type semiconductor regions 52 are arranged under and near the pin No. 38 and pin No. 40 among the external terminals (BP) 65. Although the sectional structure thereof is not shown, each of the buried $n^+$-type semiconductor regions 52 is provided by utilizing an empty region under and near the external terminal BP. If necessary, the buried $n^+$-type semiconductor region 52 can form a capacitor in the shape of a region 52 can form a capacitor in the shape of a p-n junction with, for example, the $p^-$-type semiconductor substrate 50. By way of example, this capacitor is used instead of the externally-mounted capacitor of the resin-encapsulated semiconductor device 20. Moreover, if necessary, the buried $n^+$-type semiconductor region 52 can be used as a resistor.

The resin-encapsulated semiconductor device 20 is installed on a packaging circuit board (PCB) which is built in the color VTR 1. Thus, since the resin-encapsulated semiconductor device 20 is reduced in size as stated before, it can heighten the density of packaging on the packaging circuit board. Also, the resin-encapsulated semiconductor device 20 results in contributing to sharp reduction in the size of the color VTR 1.

Further, the resin-encapsulated semiconductor device 20 can decrease the number of components on the packaging circuit board or can reduce the lenghts and number of wiring lines among the components. It is therefore possible to enhance the electrical reliability of the packaging circuit board, to make the size thereof smaller and the weight thereof lighter, and to curtail the cost thereof. As a result, the color VTR 1 can attain an enhanced electrical reliability, a smaller size as well as a lighter weight, and a curtailed cost.

EMBODIMENT II

This embodiment is the second embodiment of the present invention in which the foregoing semiconductor integrated circuit device 10 is assembled in a resin-encapsulated semiconductor device 20 of DIP (Dual In-line Package) structure.

Figure 16:
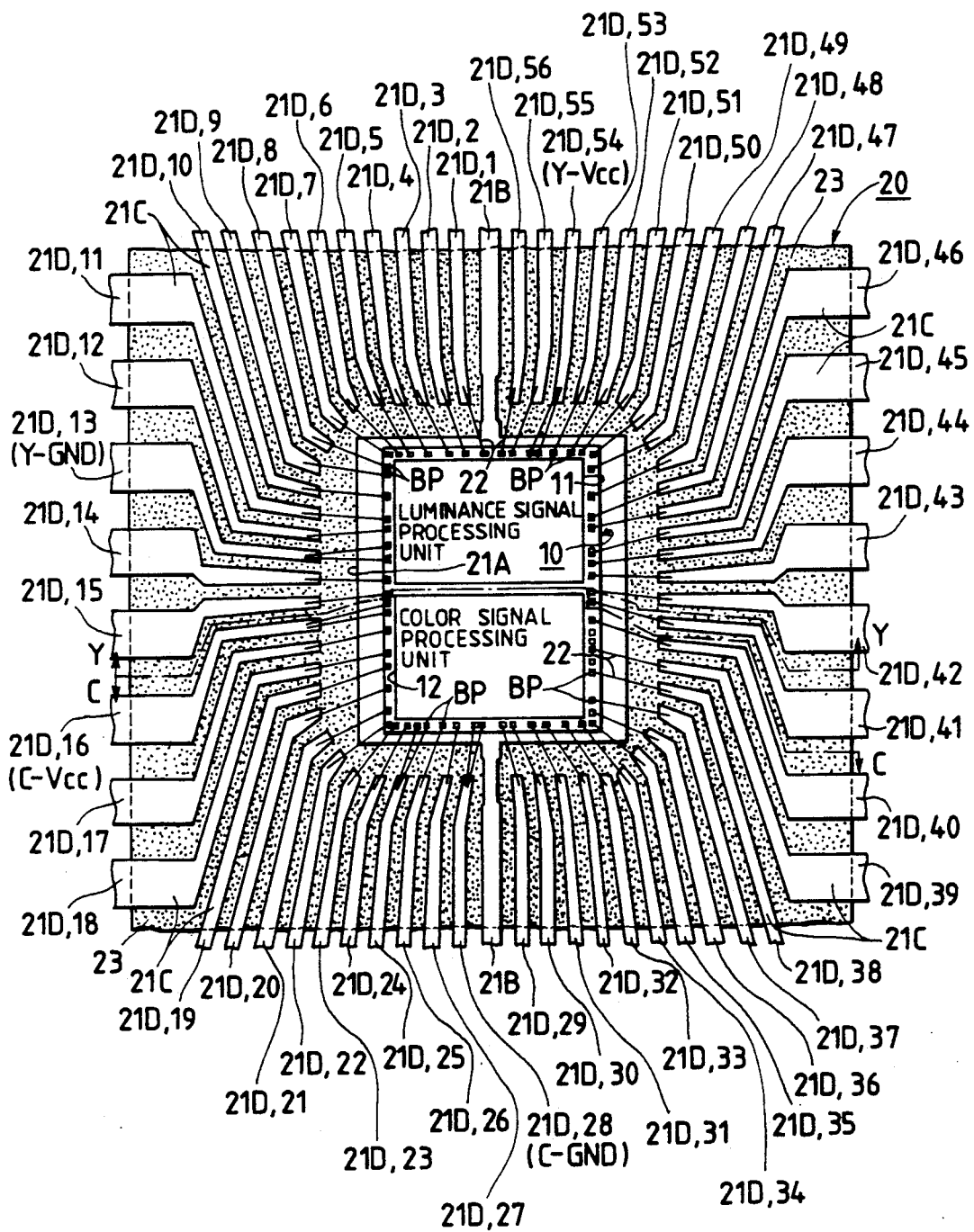
FIG. 16 is a plan view, partially in section, of a resin-encapsulated semiconductor device which is Embodiment II of the present invention.

The construction of the resin-encapsulated semiconductor device being Embodiment II of the present invention is illustrated in FIG. 16 (a partially-sectional plan view).

The resin-encapsulated semiconductor device 20 of the embodiment II has the DIP structure. It includes substantially the same circuit device as the semiconductor integrated circuit device 10 of the embodiment I.

Although, in the above, the invention made by the inventor has been concretely described on the basis of the embodiments, it is a matter of course that the present invention is not restricted to the foregoing embodiments, but that it can be variously altered within a scope not departing from the purport thereof. By way of example, the present invention may well divide the semiconductor integrated circuit device built in the color VTR as stated before, into the individual forms of a semiconductor integrated circuit device in which the luminance signal processing unit and color signal processing unit of the record circuit are assembled and a semiconductor integrated circuit device in which the luminance signal processing unit and color signal processing unit of the playback circuit are assembled.

In addition, the present invention may well furnish the semiconductor integrated circuit device with a circuit including MISFETs or complementary MISFETs (CMOS).

Besides, the present invention may well furnish the semiconductor integrated circuit device with circuits of other functions, for example, a record amplifier circuit and a playback amplifier circuit.

Moreover, the present invention is not restricted to the color VTR, but it is extensively applicable to ICs for video controls, ICs for audio controls, etc. Further, it is extensively applicable to electron devices such as a color VTR camera in which these ICs are built.

Effects which are attained by typical aspects of performance of the present invention are briefly explained as follows:

The density of integration of a semiconductor integrated circuit device for use in a color VTR can be heightened.

The picture quality of the color-picture of a color VTR can be enhanced.

The density of integration of the semiconductor integrated circuit device can be heightened, while at the same time, the picture quality of the color picture can be enhanced.

The available percentage of the semiconductor integrated circuit device in the production thereof can be raised.

The probing accuracy of the semiconductor integrated circuit device can be improved.

The electrostatic breakdown voltage of the semiconductor integrated circuit device can be raised.

The latch-up phenomenon of the semiconductor integrated circuit device can be prevented.

In a semiconductor integrated circuit device having bipolar transistors, the current gains of the bipolar transistors can be increased.

In a semiconductor integrated circuit device having IIL circuits of stacked structure, the occupation area of the IIL circuits can be contracted to heighten the density of integration of the circuit device.

In the semiconductor integrated circuit device having IIL circuits of stacked structure, the operating margins of the IIL circuits can be widened.

What is claimed is:

1. A semiconductor integrated circuit device comprising:
    (a) a semiconductor substrate which has a principle surface;
    (b) a first circuit for processing a luminance signal of a video signal of a video tape recorder (VTR) and a second circuit for processing a color signal of the video signal of the VTR, said first and second circuits being respectively provided in regions of said principal surface opposing to each other; and
    (c) an isolating means for electrically isolating said first and second circuits from each other, which is provided in an interspace formed between said first and second circuits on said principle surface of said semiconductor substrate,
    wherein said isolating means is supplied with a bias which is stable A.C.-wise.

2. A semiconductor integrated circuit device according to claim 1, further comprising an element isolation region which is provided on said principal surface of said semiconductor substrate, and a plurality of active island regions which are respectively surrounded with said element isolation region, wherein said first and second circuits include as their main constituents bipolar transistors which are formed in first and second ones of said plurality of active island regions, respectively, and wherein said isolating means includes a third one of said plurality of active island regions which lies between the first and second active island regions and which is supplied with said bias.

3. A semiconductor integrated circuit device according to claim 2, wherein said active island region of said isolating means has a higher impurity density at a part lying in contact with said element isolation region, than at any other part.

4. A semiconductor integrated circuit device according to claim 3, wherein each of said first and second circuits includes a record circuit and a playback circuit.

5. A semiconductor integrated circuit device according to claim 4, wherein said bias which is supplied to said isolating means is a D.C. reference supply voltage which is generated by a stabilized power source circuit.

6. A semiconductor integrated circuit device according to claim 1, wherein said isolating means includes a logic circuit for said bias which is stable A.C.-wise.

7. A semiconductor integrated circuit device comprising:
    a first circuit for processing a luminance signal of a video signal of a video tape recorder (VTR) and a second circuit for processing a color signal of the video signal of the VTR, which are constructed in different regions of a principal surface of an identical semiconductor substrate and each of which includes a plurality of circuit regions, said circuit regions of each of said first and second circuits being in shapes of rectangles among which a length of one latus is constant or integral times greater; and
    circuit operation supply voltage wiring and reference supply voltage wiring which are respectfully laid on one-end sides of the rectangular circuit regions and the other-end sides thereof.

8. A semiconductor integrated circuit device according to claim 7, wherein said circuit operation supply voltage wiring on one-end sides or said reference supply voltage wiring on the other-end sides of said circuit regions of said first circuit, and said reference supply voltage wiring on the other-end sides or said circuit operation supply voltage wiring on one-end sides of said circuit regions of said second circuit are laid at a boundary part between said first and second circuits.

9. A resin-encapsulated semiconductor device comprising:
    a semiconductor integrated circuit device including a first circuit for processing a luminance signal of a video signal of a video tape recorder (VTR) and a second circuit for processing a color signal of the video signal of the VTR, which are constructed in different regions of a principal surface of an identical semiconductor substrate and each of which includes a plurality of circuit regions; and circuit operation supply voltage wiring and reference supply voltage wiring which are respectively laid on one-end sides and the other-end sides of said circuit regions of each of said first and second circuits, said semiconductor integrated circuit device being sealed with a resin.

10. A semiconductor integrated circuit device comprising:

a first circuit for processing a luminance signal of a video signal of a video tape recorder (VTR) and a second circuit for processing a color signal of the video signal of the VTR, which are constructed in different regions of a principal surface of an identical semiconductor substrate;

supply-voltage wiring lines which are led in from supply-voltage external terminals and which are laid in said first circuit; and supply-voltage wiring lines which are led in from supply-voltage external terminals different from those of said supply-voltage external terminals of said first circuit and which are laid in said second circuit.

11. A semiconductor integrated circuit device according to claim 10, wherein each of said supply-voltage external terminals of said first circuit is divided into a plurality of external terminals, from which the supply-voltage wiring lines are respectively led in, and each of said supply-voltage external terminals of said second circuit is divided into a plurality of external terminals, from which the supply-voltage wiring lines are respectively led in.

12. A semiconductor integrated circuit device according to claim 11, wherein one and another of the plurality of divisional supply-voltage external terminals of said first circuit are short-circuited to each other through supply-voltage wiring lines which are led in from the respective divisional supply-voltage terminals.

13. A semiconductor integrated circuit device according to claim 12, wherein the supply voltage wiring led in from the supply voltage external terminal of said first circuit, and the supply voltage wiring led in from the supply-voltage external terminal of said second circuit are both laid at a boundary part between said first and second circuits.

14. A semiconductor integrated circuit device comprising:

a first circuit for processing a luminance signal of a video signal of a video tape recorder (VTR) and a second circuit for processing a color signal of the video signal of the VTR, which are constructed in different regions of a principal surface of an identical semiconductor substrate; and a common circuit which is shared by said first and second circuits and which is arranged at a boundary part between said first and said second circuits.

15. A semiconductor integrated circuit device according to claim 14, wherein wiring for connecting said first circuit with said common circuit and wiring for connecting said second circuit with said common circuit are laid independently of each other.

16. A semiconductor integrated circuit device according to claim 15, wherein said common circuit is a stabilized power source circuit, and a D.C. reference supply voltage generated by said stabilized power source circuit is fed to said first and second circuits independently of each other, through an external terminal and an externally mounted noise reducing capacitor.

17. A semiconductor integrated circuit device according to claim 16, wherein said external terminal which is fed with the D.C. reference supply voltage generated by said stabilized power source circuit is interposed between an external terminal for a signal of said first circuit and an external terminal for a signal of said second circuit.

18. An electron device according to claim 1, in which said semiconductor integrated circuit device is assembled.

* * * * *